(12) United States Patent
Jang et al.

(10) Patent No.: US 12,132,476 B2
(45) Date of Patent: Oct. 29, 2024

(54) POWER SUPPLY SWITCH CIRCUIT AND OPERATING METHOD THEREOF

(71) Applicant: SAMSUNG ELECTRO-MECHANICS CO., LTD., Suwon-si (KR)

(72) Inventors: Youngwong Jang, Suwon-si (KR); Jeonghoon Kim, Suwon-si (KR); Shinichi Iizuka, Suwon-si (KR); Jongok Ha, Suwon-si (KR); Hyejin Lee, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 275 days.

(21) Appl. No.: 17/836,518

(22) Filed: Jun. 9, 2022

(65) Prior Publication Data

US 2023/0011598 A1 Jan. 12, 2023

(30) Foreign Application Priority Data

Sep. 24, 2021 (KR) .................. 10-2021-0126533

(51) Int. Cl.
*H03K 19/20* (2006.01)
*H03F 3/21* (2006.01)
*H03K 17/687* (2006.01)
*H03K 19/17772* (2020.01)

(52) U.S. Cl.
CPC .......... *H03K 17/6871* (2013.01); *H03F 3/21* (2013.01); *H03K 19/17772* (2013.01); *H03K 19/20* (2013.01)

(58) Field of Classification Search
CPC ......... H03K 17/6871; H03K 19/17772; H03K 19/20; H03F 3/21
See application file for complete search history.

(56) References Cited

U.S. PATENT DOCUMENTS

| | | | |
|---|---|---|---|
| 5,661,685 A * | 8/1997 | Lee | G06F 30/34 365/185.26 |
| 7,973,595 B2 | 7/2011 | Kimura | |
| 9,571,104 B1 | 2/2017 | Menezes | |
| 10,855,258 B1 * | 12/2020 | Robertson | H04R 3/00 |
| 11,533,029 B2 * | 12/2022 | Yoo | H03F 3/195 |
| 2016/0277019 A1 | 9/2016 | Cical et al. | |
| 2022/0091625 A1 * | 3/2022 | Luo | H02M 1/32 |
| 2023/0038876 A1 * | 2/2023 | Jang | H03K 17/6871 |
| 2023/0043939 A1 * | 2/2023 | Kim | H03F 1/0211 |
| 2023/0111377 A1 * | 4/2023 | Jang | H03F 3/245 330/108 |

FOREIGN PATENT DOCUMENTS

| | | |
|---|---|---|
| JP | 5863229 B2 | 2/2016 |
| KR | 10-2017-0128529 A | 11/2017 |

* cited by examiner

Primary Examiner — Adolf D Berhane
(74) Attorney, Agent, or Firm — NSIP Law

(57) ABSTRACT

A power supply switch circuit includes a first transistor that switches supplying of a first power supply voltage to a power supply terminal of a power amplifier, a switch controller that controls the first transistor and to which a second power supply voltage is applied, and a voltage selector that selects a higher voltage among the first power supply voltage and the second power supply voltage. The selected higher voltage is applied to a body terminal of the first transistor or a gate terminal of the first transistor.

35 Claims, 21 Drawing Sheets

FIG. 4

| bit2 | bit1 | $V_{SW1}$ | $V_{SW2}$ | SW1 | SW2 |
|---|---|---|---|---|---|
| 0 | 0 | OFF | OFF | OFF | OFF |
| 0 | 1 | OFF | ON | OFF | ON |
| 1 | 0 | ON | OFF | ON | OFF |
| 1 | 1 | OFF | OFF | OFF | OFF |

FIG. 7

| bit2 | bit1 | $V_{LOG2}$ | $V_{LOG1}$ |
|------|------|------------|------------|
| 0 | 0 | 1 | 1 |
| 0 | 1 | 1 | 0 |
| 1 | 0 | 0 | 1 |
| 1 | 1 | 1 | 1 |

POWER SUPPLY SWITCH CIRCUIT AND OPERATING METHOD THEREOF

CROSS-REFERENCE TO RELATED APPLICATIONS

This application claims the benefit under 35 USC 119(a) of Korean Patent Application No. 10-2021-0089109 filed in the Korean Intellectual Property Office on Jul. 7, 2021, and Korean Patent Application No. 10-2021-0126533 filed in the Korean Intellectual Property Office on Sep. 24, 2021, the entire disclosures of which are incorporated herein by reference for all purposes.

BACKGROUND

1. Field

The present disclosure relates to a power supply switch circuit and an operating method thereof.

2. Description of the Background

As wireless communication standards evolve, a plurality of communication standards such as 2G, Wi-Fi, Bluetooth, 3G, 4G, and 5G are used in one device (for example, a smartphone). As the plurality of communication standards are used in one device, a power amplifier to output a transmission signal is used for each communication standard. That is, in order to output a signal conforming to the plurality of communication standards, a plurality of power amplifiers corresponding to the plurality of communication standards may be required.

A power amplifier operates by receiving power from the outside, and in general, a separate power supply integrated circuit (IC) for supplying power to one power amplifier is used. For example, four power supply ICs are used to operate four power amplifiers. When one of the plurality of communication standards is used, another communication standard may not be simultaneously used. For example, when the 4G communication standard is used, the 3G communication standard may not be used. Accordingly, a power supply IC corresponding to the unused communication standard needs to be effectively used for other communication standards.

The above information is presented as background information only to assist with an understanding of the present disclosure. No determination has been made, and no assertion is made, as to whether any of the above might be applicable as prior art with regard to the disclosure.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

In one general aspect, a power supply switch circuit includes a first transistor that switches supplying of a first power supply voltage to a power supply terminal of a power amplifier, a switch controller that controls the first transistor and to which a second power supply voltage is applied, and a voltage selector that selects a higher voltage among the first power supply voltage and the second power supply voltage, wherein the selected higher voltage is applied to a body terminal of the first transistor or a gate terminal of the first transistor.

The power supply switch circuit may further include a second transistor that switches supplying of a third power supply voltage to the power supply terminal, wherein the voltage selector may select a highest voltage among the first power supply voltage, the second power supply voltage, and the third power supply voltage as the selected higher voltage.

When the first transistor is a p-type transistor, the selected higher voltage may be applied to the body terminal and the gate terminal of the first transistor.

When the first transistor is an n-type transistor, the selected higher voltage may be applied to the gate terminal of the first transistor.

The switch controller may include a buffer circuit that receives the selected higher voltage and generates a switching control signal having the selected higher voltage, and the switching control signal may be applied to the gate terminal of the first transistor.

The power supply switch circuit may further include a second transistor that is connected in parallel to the first transistor and switches supplying the first power supply voltage to the power supply terminal together with the first transistor, wherein the first transistor may be a p-type transistor and the second transistor is an n-type transistor, and the selected higher voltage may be applied to a gate terminal of the second transistor.

The p-type transistor and the n-type transistor may be simultaneously turned on and simultaneously turned off.

The first power supply voltage may vary according to an envelope of a radio frequency (RF) signal inputted to the power amplifier.

The voltage selector may include a comparator that compares the first power supply voltage and the second power supply voltage, a first switch that switches the first power supply voltage as the selected higher voltage in response to an output of the comparator, and a second switch that switches the second power supply voltage as the selected higher voltage in response to the output of the comparator.

The voltage selector may include a first selection circuit that compares two of the first power supply voltage, the second power supply voltage, and the third power supply voltage to output a first voltage that is a higher voltage thereof, and a second selection circuit that compares the first voltage with the remaining power supply voltage except for the two power supply voltages and outputs the selected higher voltage.

The switch controller may set the first and second transistors to be simultaneously turned on during a first period when the first transistor is turned off and the second transistor is turned on.

The switch controller may maintain turning on of the first transistor by delaying turning off of the first transistor during the first period.

The switch controller may include a delay circuit delaying a first logic signal that controls the first transistor and a second logic signal that controls the second transistor.

The delay circuit may include a first delay circuit including a first delay element delaying the first logic signal, and a first NAND gate receiving the first logic signal and a signal delayed by the first delay element, and a second delay circuit including a second delay element delaying the second logic signal, and a second NAND gate receiving the second logic signal and a signal delayed by the second delay element.

Each of the first and second delay elements may include a resistor and a capacitor, and the first and second logic signals may be delayed corresponding to a value of a time constant determined by the resistor and the capacitor.

The second power supply voltage may be a driving power supply voltage used to operate the switch controller.

In another general aspect, a power supply switch circuit includes a first transistor connected between a first power supply circuit outputting a first voltage and a power supply terminal of a power amplifier, a second transistor connected between a second power supply circuit outputting a second voltage and the power supply terminal, a switch controller that controls the first and second transistors and to which a third voltage is applied, and a voltage selector that selects a higher voltage among at least one of the first voltage and the second voltage, and the third voltage, wherein the selected higher voltage is applied to a body terminal or gate terminal of at least one of the first and second transistors.

The voltage selector may select a highest voltage among the first voltage, the second voltage, and the third voltage as the selected higher voltage.

When the at least one of the first and second transistors is a p-type transistor, the selected higher voltage may be applied to a body terminal and a gate terminal of the at least one of the first and second transistors.

The switch controller may include a buffer circuit that is supplied with the selected higher voltage and generates a switching control signal having the selected higher voltage, and the switching control signal may be applied to a gate terminal of the at least one of the first and second transistors.

The power supply switch circuit may further include a third transistor that is connected in parallel to the at least one of the first and second transistors and is switched together with the at least one of the first and second transistors, wherein the at least one of the first and second transistors may be a p-type transistor and the third transistor may be an n-type transistor, and the selected higher voltage may be applied to a gate terminal of the third transistor.

The first and second voltages may vary according to an envelope of a radio frequency (RF) signal inputted to the power amplifier.

The third voltage may be a driving power supply voltage used to operate the switch controller.

In another general aspect, an operating method of a power supply switch circuit including a switch circuit that switches at least one of a first power supply voltage and a second power supply voltage to supply the at least one of the first power supply voltage and the second power supply voltage to a power supply terminal of a power amplifier, and a switch controller that controls the switch circuit, the operating method includes selecting a higher voltage among at least one of the first power supply voltage and the second power supply voltage, and a third power supply voltage applied to the switch controller, and applying the selected higher voltage to a body terminal or gate terminal of a transistor included in the switch circuit.

The selecting may include selecting a highest voltage among the first power supply voltage, the second power supply voltage, and the third power supply voltage as the selected higher voltage.

The applying may include applying, when the transistor is a p-type transistor, the selected higher voltage to a body terminal and a gate terminal of the transistor.

The operating method may further include in a first period, by turning on a first switch switching the first power supply voltage and by turning off a second switch switching the second power supply voltage, supplying the first power supply voltage to the power supply terminal, in a second period, by maintaining a turned on state of the first switch and by turning on the second switch, simultaneously supplying the first power supply voltage and the second power supply voltage to the power supply terminal, and after the second period, by turning off the first switch and by maintaining a turned on state of the second switch, supplying the second power supply voltage to the power supply terminal.

In the second period, a logic signal controlling turning off of the first switch may be delayed during the second period.

In the second period, a voltage between the first power supply voltage and the second power supply voltage may be supplied to the power supply terminal.

The third power supply voltage may be a driving power supply voltage used to operate the switch controller.

In another general aspect, a power supply switch circuit includes a voltage selector to select a highest voltage of at least one of a first power supply voltage and a second power supply voltage, and a third power supply voltage, a switch circuit comprising a first switch to switch the first voltage to a power supply terminal of a power amplifier, and a second switch to switch the second voltage to the power supply terminal of the power amplifier, and a switch controller to which the third power supply voltage is applied to control the switch circuit to supply the at least one of the first power supply voltage and the second power supply voltage to the power supply terminal in response to the selection of the highest voltage.

One or more of the first switch and the second switch may include a transistor, and the selected highest voltage may be applied to a body terminal or gate terminal of at least one transistor of the one or more of the first switch and the second switch.

The voltage selector may select the highest voltage among the first power supply voltage, the second power supply voltage, and the third power supply voltage as the selected highest voltage.

The at least one transistor may be one or more of a p-type transistor and an n-type transistor. When the at least one transistor is a p-type transistor, the selected highest voltage may be applied to a body terminal and a gate terminal of the at least one transistor, and when the at least one transistor is an n-type transistor, the selected highest voltage may be applied to the gate terminal of the at least one transistor.

The switch controller may include a buffer circuit that receives the selected highest voltage and generates a switching control signal having the selected highest voltage, and the switching control signal may be applied to a gate terminal of the at least one transistor.

Other features and aspects will be apparent from the following detailed description, the drawings, and the claims.

BRIEF DESCRIPTION OF THE DRAWINGS

FIG. 4 illustrates a logic table according to an embodiment.

FIG. 7 illustrates an input/output logic table of the logic circuit of FIG. 6.

Throughout the drawings and the detailed description, the same reference numerals refer to the same elements. The drawings may not be to scale, and the relative sizes, proportions, and depictions of elements in the drawings may be exaggerated for clarity, illustration, and convenience.

DETAILED DESCRIPTION

Figure 1:
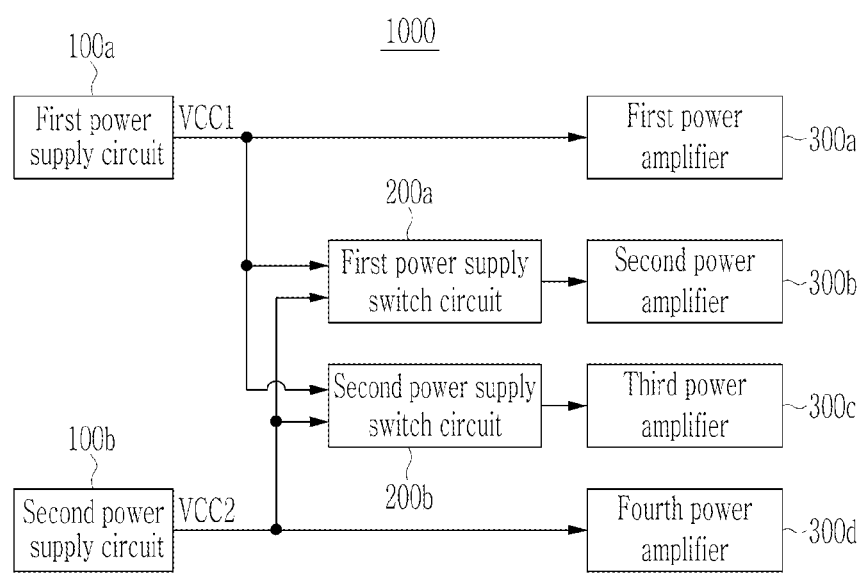
FIG. 1 illustrates a block diagram of a transmitter system according to an embodiment.

Hereinafter, while example embodiments of the present disclosure are described in detail with reference to the accompanying illustrative drawings, it is noted that examples are not limited to the same.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of this disclosure. For example, the sequences of operations described herein are merely examples, and are not limited to those set forth herein, but may be changed as will be apparent after an understanding of this disclosure, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of this disclosure.

Throughout the specification, when an element, such as a layer, region, or substrate is described as being "on," "connected to," or "coupled to" another element, it may be directly "on," "connected to," "coupled to," or "electrically connected to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items; likewise, "at least one of" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms, such as "above," "upper," "below," "lower," and the like, may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above," or "upper" relative to another element would then be "below," or "lower" relative to the other element. Thus, the term "above" encompasses both the above and below orientations depending on the spatial orientation of the device. The device may also be oriented in other ways (rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

Herein, it is noted that use of the term "may" with respect to an example, for example, as to what an example may include or implement, means that at least one example exists in which such a feature is included or implemented while all examples are not limited thereto.

Throughout the specification, a radio frequency (RF) signal includes Wi-Fi (IEEE 802.11 family, etc.), WiMAX (IEEE 802.16 family, etc.), IEEE 802.20, LTE (long term evolution), Ev-DO, HSPA+, HSDPA+, HSUPA+, EDGE, GSM, GPS, GPRS, CDMA, TDMA, DECT, Bluetooth, 3G, 4G, 5G, and any other wireless and wired protocols designated thereafter, but are not limited thereto.

The features of the examples described herein may be combined in various ways as will be apparent after an understanding of this disclosure. Further, although the examples described herein have a variety of configurations, other configurations are possible as will be apparent after an understanding of this disclosure.

According to at least one of the embodiments, it is possible to provide a power supply switch circuit that switches at least two power supply voltages to supply them to a power amplifier and to provide an operating method thereof.

According to at least one of the embodiments, it is possible to provide a power supply switch circuit that stably supplies a power supply voltage to a power amplifier and to provide an operating method thereof.

FIG. 1 illustrates a block diagram of a transmitter system 1000 according to an embodiment.

As shown in FIG. 1, the transmitter system 1000 according to the embodiment may include first and second power supply circuits 100a and 100b, first and second power supply switch circuits 200a and 200b, and first to fourth power amplifiers 300a to 300d. FIG. 1 illustrates, as an example, a case in which the transmitter system 1000 is configured with four power amplifiers and the power supply switch circuits related thereto are two, but the number of the power amplifiers and the number of the power supply switch circuits may be changed.

The first power supply circuit 100a generates and outputs a first power supply voltage VCC1. According to the embodiment, the first power supply voltage VCC1 may be applied to a power supply terminal of the first power amplifier 300a, the second power amplifier 300b, or the third power amplifier 300c. To support an average power tracking (APT) mode, a value of the first power supply voltage VCC1 may vary according to an envelope of an RF signal inputted to the first power amplifier 300a, the second power amplifier 300b, or the third power amplifier 300c.

The second power supply circuit 100b generates and outputs a second power supply voltage VCC2. According to the embodiment, the second power supply voltage VCC2 may be applied to a power supply terminal of the second power amplifier 300b, the third power amplifier 300c, or the fourth power amplifier 300d. To support an average power tracking (APT) mode, a value of the second power supply voltage VCC2 may vary according to an envelope of an RF signal inputted to the second power amplifier 300b, the third power amplifier 300c, or the fourth power amplifier 300d.

Meanwhile, each of the first and second power supply circuits 100a and 100b may be implemented as a power management integrated circuit (PM IC).

The first power supply switch circuit 200a may receive the first power supply voltage VCC1 from the first power supply circuit 100a, and may receive the second power supply voltage VCC2 from the second power supply circuit 100b. The first power supply switch circuit 200a may select one of the input first and second power supply voltages VCC1 and VCC2 to output (supply) it to the power supply terminal of the second power amplifier 300b. For example, when the first power amplifier 300a does not operate, the first power supply switch circuit 200a may select the first power supply voltage VCC1 to output it to the power supply terminal of the second power amplifier 300b. In addition, when the fourth power amplifier 300d does not operate, the first power supply switch circuit 200a may select the second power supply voltage VCC2 to output it to the power supply terminal of the second power amplifier 300b.

The second power supply switch circuit 200b receives the first power supply voltage VCC1 from the first power supply circuit 100a, and receives the second power supply voltage VCC2 from the second power supply circuit 100b. The second power supply switch circuit 200b may select one of the input first and second power supply voltages VCC1 and VCC2 to output (supply) it to a power supply terminal of the third power amplifier 300c. For example, when the first power amplifier 300a does not operate, the second power supply switch circuit 200b may select the first power supply voltage VCC1 to output it to the power supply terminal of the third power amplifier 300c. In addition, when the fourth power amplifier 300d does not operate, the second power supply switch circuit 200b may select the second power supply voltage VCC2 to output it to the power supply terminal of the third power amplifier 300c.

The first power amplifier 300a operates by receiving the first power supply voltage VCC1 from the first power supply circuit 100a, and amplifies and outputs an input radio frequency (RF) signal. The input RF signal of the first power amplifier 300a may be an RF signal for the first communication standard.

The second power amplifier 300b operates by receiving a power supply voltage (that is, first power supply voltage VCC1 or second power supply voltage VCC2) selected by the first power supply switch circuit 200a, and amplifies and outputs an input RF signal. The input RF signal of the second power amplifier 300b may be an RF signal for the second communication standard.

The third power amplifier 300c operates by receiving a power supply voltage (that is, first power supply voltage VCC1 or second power supply voltage VCC2) selected by the second power supply switch circuit 200b, and amplifies and outputs an input RF signal. The input RF signal of the third power amplifier 300c may be an RF signal for the third communication standard.

The fourth power amplifier 300d operates by receiving the second power supply voltage VCC2 from the second power supply circuit 100b, and amplifies and outputs an input radio frequency (RF) signal. The input RF signal of the fourth power amplifier 300d may be an RF signal for the fourth communication standard.

Here, the first to fourth communication standards may be different communication standards, and each thereof may be one of 2G, Wi-Fi, Bluetooth, 3G, 4G, and 5G communication standards. Meanwhile, the first to fourth communication standards may be communication standards that define different bands in the 5G communication standard.

According to this embodiment, by sharing the power supply voltage through the power supply switch circuit, the number of power supply circuits may be reduced. Generally, when there are four power amplifiers, four power supply circuits are used, but in FIG. 1, the number of the power supply circuits may be reduced to two by using the power supply switch circuit. Hereinafter, a detailed configuration and operation method of a power supply switch circuit such as the first and second power supply switch circuits 200a and 200b will be described.

Figure 2:
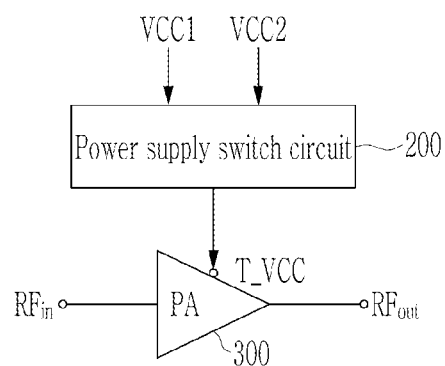
FIG. 2 illustrates a connection relationship between a power supply switch circuit and a power amplifier according to an embodiment.

FIG. 2 illustrates a connection relationship between a power supply switch circuit 200 and a power amplifier 300 according to an embodiment.

The power supply switch circuit 200 receives the first power supply voltage VCC1 and the second power supply voltage VCC2 as inputs, and selects one of the received first and second power supply voltages VCC1 and VCC2 to output it to a power supply terminal T_VCC of the power amplifier 300. Here, the power supply switch circuit 200 may be the first power supply switch circuit 200a or the second power supply switch circuit 200b of FIG. 1.

In FIG. 1 and FIG. 2, the power supply switch circuit 200 is shown to receive two power supply voltages, but may receive at least two power supply voltages. In this case, the power supply switch circuit 200 may select one of at least two power supply voltages.

The power amplifier 300 includes an input terminal RFin, an output terminal RFout, and the power supply terminal T_VCC. An RF signal is inputted to the input terminal RFin, and an amplified signal is outputted from the output terminal Rout. The power supply voltage VCC1 or VCC2 is applied to the power supply terminal T_VCC, and the power amplifier 300 is operated by the applied power supply voltage VCC1 or VCC2. The power amplifier 300 may be implemented as a transistor. When the power amplifier 300 is implemented as a bipolar junction transistor (BJT), the input terminal RFin may be a base, and the power supply terminal T_VCC may be a collector or an emitter. Meanwhile, when the power amplifier 300 is implemented as a field effect transistor (FET), the input terminal RFin may be a gate, and the power supply terminal T_VCC may be a drain or a source.

Meanwhile, the power supply switch circuit 200 and the power amplifier 300 of FIG. 2 may be combined to implement a single power amplifier module.

Figure 3A:
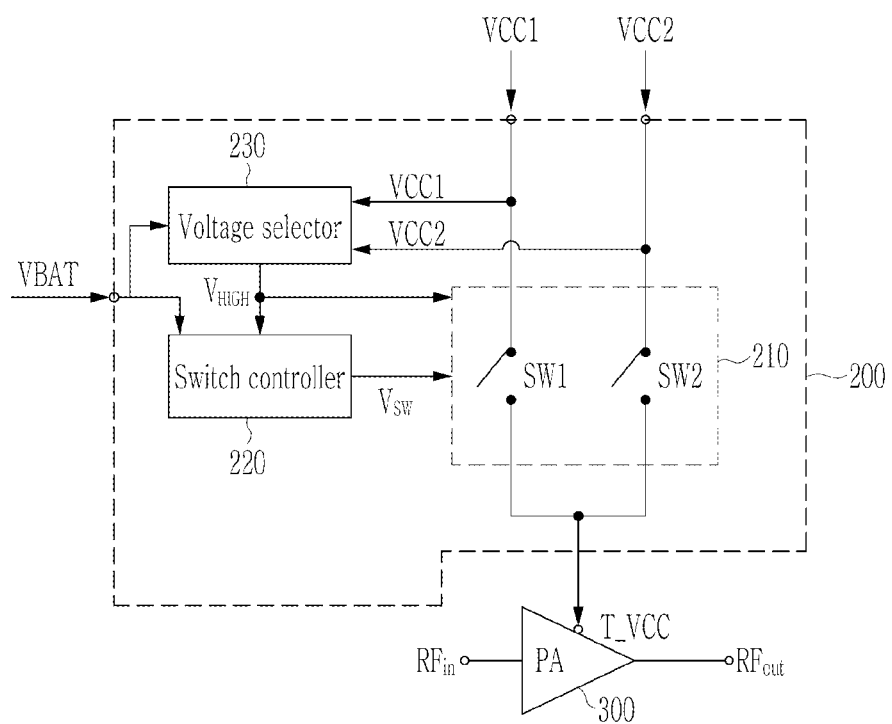
FIG. 3A illustrates an inner configuration of a power supply switch circuit according to an embodiment.

FIG. 3A illustrates an inner configuration of the power supply switch circuit 200 according to the embodiment.

As shown in FIG. 3A, the power supply switch circuit 200 according to the embodiment may include a switch circuit 210, a switch controller 220, and a voltage selector 230.

The switch circuit 210 may include a first switch SW1 and a second switch SW2. The first switch SW1 may switch supplying of the first power supply voltage VCC1 to the power supply terminal T_VCC of the power amplifier 300, and the second switch SW2 may switch supplying of the second power supply voltage VCC2 to the power supply terminal T_VCC of the power amplifier 300. The first switch SW1 may be connected between the first power supply circuit 100a and the power supply terminal T_VCC of the power amplifier 300, and the second switch SW2 may be connected between the second power supply circuit 100b and the power supply terminal T_VCC of the power amplifier 300.

The switch controller 220 may receive a bit signal (digital signal) from the outside, and may generate a switching driving signal $V_{SW}$ that switches the switch circuit 210 in response to the received bit signal. The generated switching driving signal $V_{SW}$ is outputted to the switch circuit 210. Here, as an example, a bit signal inputted from the outside may be 2 bits. The switching driving signal $V_{SW}$ may include a first switching driving signal $V_{SW1}$ that controls the first switch SW1 and a second switching driving signal $V_{SW2}$ that controls the second switch SW2.

When the first switching driving signal $V_{SW1}$ is an ON driving signal and the second switching driving signal $V_{SW2}$ is an OFF driving signal, the first switch SW1 is turned on and the second switch SW2 is turned off. Accordingly, the first power supply voltage VCC1 is applied to the power supply terminal T_VCC of the power amplifier 300 through the first switch SW1.

When the first switching driving signal $V_{SW1}$ is an OFF driving signal and the second switching driving signal $V_{SW2}$ is an ON driving signal, the first switch SW1 is turned off and the second switch SW2 is turned on. Accordingly, the second power supply voltage VCC2 is applied to the power supply terminal T_VCC of the power amplifier 300 through the second switch SW2.

FIG. 4 illustrates a logic table according to an embodiment.

In FIG. 4, bit1 and bit2 are external bit signals inputted to the switch controller 220. As shown in FIG. 4, when the external bit signals are 00 and 11, both the first and second switching driving signal $V_{SW1}$ and $V_{SW2}$ are an OFF driving signal, and both the first and second switches SW1 and SW2 are in an OFF state. The switch controller 220 may include a logic circuit having a logic table as shown in FIG. 4, which will be described in more detail below.

Meanwhile, a power supply voltage used to operate the switch controller 220 may be applied to the switch controller 220. The switch controller 220 may include a control circuit including a logic circuit, a driving circuit (for example, a buffer circuit), and the like. Here, the control circuit may be operated by a driving power supply voltage VBAT as a power supply voltage. As an example, the switch controller 220 may receive the driving power supply voltage VBAT from a separate power supply circuit different from the first and second power supply circuits 100a and 100b. Here, the separate power supply circuit may be a battery included in an electronic device, and the driving power supply voltage VBAT may be an output voltage of the battery. Meanwhile, as another example, the power supply voltage applied to the switch controller 220 may be the first power supply voltage VCC1 or the second power supply voltage VCC2 described above. In the following description, the power supply voltage applied to the switch controller 220 is referred to as a 'driving power supply voltage VBAT'.

As an example, the voltage selector 230 receives the first power supply voltage VCC1 or the second power supply voltage VCC2, and the driving power supply voltage VBAT, and selects and outputs the highest voltage $V_{HIGH}$ among them. That is, the voltage selector 230 may select and output a high voltage among the first power supply voltage VCC1 and the driving power supply voltage VBAT. Alternatively, the voltage selector 230 may select and output a high voltage among the second power supply voltage VCC2 and the driving power supply voltage VBAT. Meanwhile, as another example, the voltage selector 230 receives the first power supply voltage VCC1, the second power supply voltage VCC2, and the driving power supply voltage VBAT, and may select and output the highest voltage $V_{HIGH}$ among them.

The highest voltage $V_{HIGH}$ selected by the voltage selector 230 may be inputted to the switch controller 220. The switch controller 220 may use the inputted highest voltage $V_{HIGH}$ to generate the switching driving signal $V_{SW}$. That is, the highest voltage $V_{HIGH}$ may be a control voltage for switching the first switch SW1 or the second switch SW2.

In addition, the highest voltage $V_{HIGH}$ selected by the voltage selector 230 may be inputted to the switch circuit 210. As described below, when the first switch SW1 or the second switch SW2 is implemented as a field effect transistor (FET), the highest voltage $V_{HIGH}$ may be applied to a body terminal of the FET.

Figure 3B:
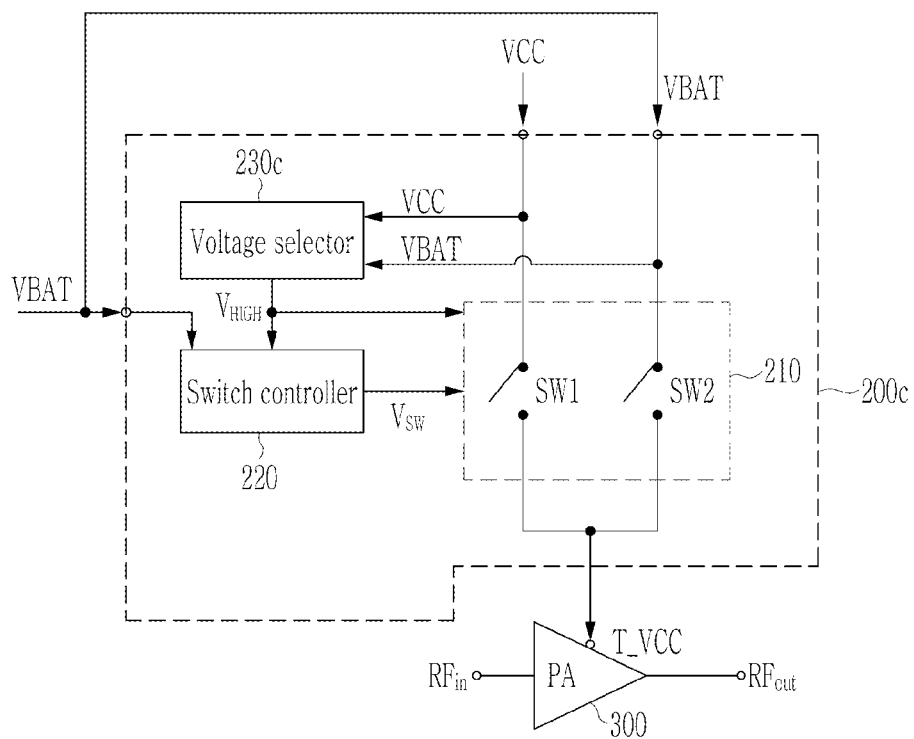
FIG. 3B illustrates a power supply switch circuit according to another embodiment.

FIG. 3B illustrates a power supply switch circuit according to another embodiment.

A power supply switch circuit 200c of FIG. 3B is similar to the power supply switch circuit 200 of FIG. 2 except that the driving power supply voltage VBAT is used as a power supply voltage applied to the power supply terminal T_VCC of the power amplifier 300, so a duplicate description thereof is omitted.

In FIG. 3B, the power supply voltage VCC may be one of the first power supply voltage VCC1 and the second power supply voltage VCC2 described with reference to FIG. 1 and FIG. 2.

The first switch SW1 may switch supplying of the power supply voltage VCC to the power supply terminal T_VCC of the power amplifier 300, and the second switch SW2 may switch supplying of the driving power supply voltage VBAT to the power supply terminal T_VCC of the power amplifier 300.

When the first switching driving signal $V_{SW1}$ is an ON driving signal and the second switching driving signal $V_{SW2}$ is an OFF driving signal, the first switch SW1 is turned on and the second switch SW2 is turned off. Accordingly, the power supply voltage VCC is applied to the power supply terminal T_VCC of the power amplifier 300 through the first switch SW1.

In addition, when the first switching driving signal $V_{SW1}$ is an OFF driving signal and the second switching driving signal $V_{SW2}$ is an ON driving signal, the first switch SW1 is turned off and the second switch SW2 is turned on. Accordingly, the driving power supply voltage VBAT is applied to the power supply terminal T_VCC of the power amplifier 300 through the second switch SW2.

The voltage selector 230c receives the power supply voltage VCC and the driving power supply voltage VBAT, and selects and outputs the highest voltage $V_{HIGH}$ among them.

The highest voltage $V_{HIGH}$ selected by the voltage selector 230 may be inputted to the switch controller 220. The switch controller 220 may use the inputted highest voltage $V_{HIGH}$ to generate the switching driving signal $V_{SW}$. That is, the highest voltage $V_{HIGH}$ may be a control voltage for switching the first switch SW1 or the second switch SW2. In addition, the highest voltage $V_{HIGH}$ selected by the voltage selector 230 may be inputted to the switch circuit 210. As described below, when the first switch SW1 or the second switch SW2 is implemented as a field effect transistor (FET), the highest voltage $V_{HIGH}$ may be applied to a body terminal of the FET.

Hereinafter, the power supply switch circuit 200 of FIG. 3A will be mainly described, but the following description may be equally applied to the power supply switch circuit 200c of FIG. 3B.

Figure 5:
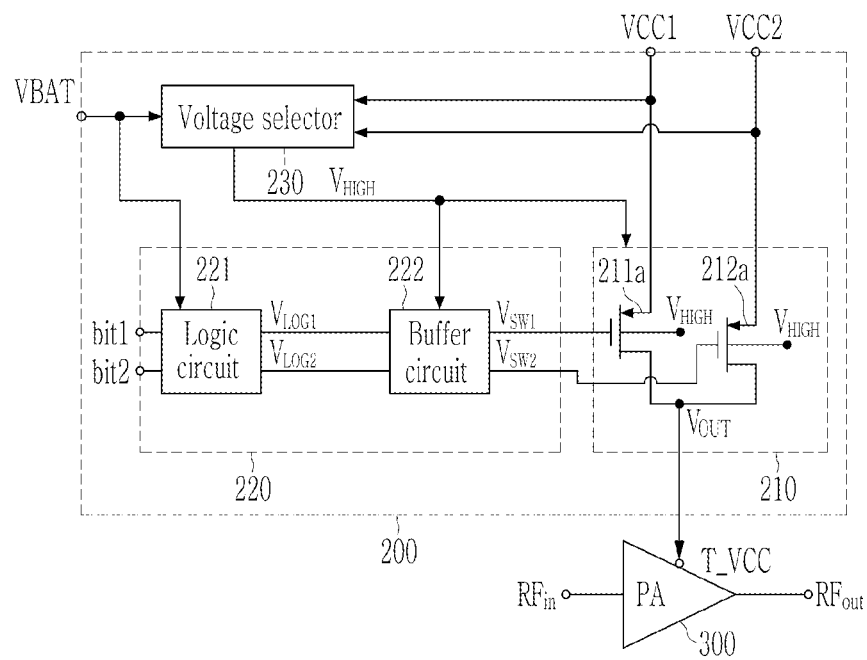
FIG. 5 illustrates an inner configuration of a switch circuit and an inner configuration of a switch controller according to an embodiment.

FIG. 5 illustrates an inner configuration of the switch circuit 210 and an inner configuration of the switch controller 220 according to the embodiment.

As shown in FIG. 5, the switch controller 220 may include a logic circuit 221 and a buffer circuit 222. In FIG. 5, $V_{OUT}$ represents the voltage of the power supply terminal T_VCC. Hereinafter, the voltage supplied by the power supply switch circuit 200 to the power supply terminal T_VCC is referred to as a 'power supply terminal voltage $V_{OUT}$'.

The logic circuit 221 receives external bit signals bit1 and bit2, and corresponds to the bit signal bit1 and bit2 to generate and output logic signals $V_{LOG1}$ and $V_{LOG2}$. The first bit signal bit1 and the first logic signal $V_{LOG1}$ are used to control the first switch SW1, and the second bit signal bit2 and the second logic signal $V_{LOG2}$ are used to control the second switch SW2. The logic circuit 221 is operated by receiving the driving power supply voltage VBAT as an operating voltage.

Figure 6:
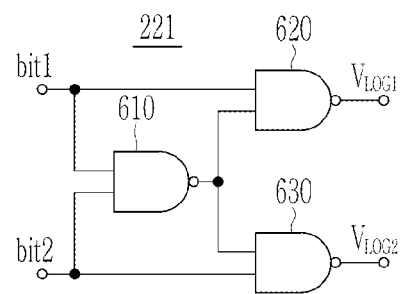
FIG. 6 illustrates a logic circuit according to an embodiment.

FIG. 6 illustrates the logic circuit 221 according to the embodiment.

As shown in FIG. 6, the logic circuit 221 according to the embodiment may include a first NAND gate 610, a second NAND gate 620, and a third NAND gate 630.

The first NAND gate 610 receives the first bit signal bit1 and the second bit signal bit2. The second NAND gate 620 receives the first bit signal bit1 and an output of the first NAND gate 610, and outputs the first logic signal $V_{LOG1}$. In addition, the third NAND gate 630 receives the second bit signal bit2 and the output of the first NAND gate 610, and outputs the second logic signal $V_{LOG2}$.

Figure 7:
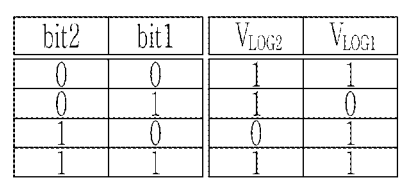

FIG. 7 illustrates an input/output logic table of the logic circuit 221 of FIG. 6.

As shown in FIG. 7, the logic circuit 221 may generate and output four states in response to two bit signals. When the first logic signal $V_{LOG1}$ is 1, it means a high level, and in this case, the first switch SW1 may be turned off. In contrast, when the first logic signal $V_{LOG1}$ is 0, it means a low level, and in this case, the first switch SW1 may be turned on. Accordingly, at the high levels of the first and second logic signals $V_{LOG1}$ and $V_{LOG2}$, the first and second switches SW1 and SW2 are turned off, and at the low levels of the first and second logic signals $V_{LOG1}$ and $V_{LOG2}$, the first and second switches SW1 and SW2 are turned on. That is, since the first logic signal $V_{LOG1}$ becomes a low level in a bit signal of 01, the first switch SW1 is turned on. Then, since the second logic signal $V_{LOG2}$ becomes a low level in a bit signal of 10, the second switch SW2 is turned on. In the remaining cases, since the first and second logic signals $V_{LOG1}$ and $V_{LOG2}$ become high levels, both the first and second switches SW1 and SW2 are turned off.

The buffer circuit 222 may receive the first and second logic signals $V_{LOG1}$ and $V_{LOG2}$ from the logic circuit 221, and may generate and output the switching driving signals $V_{SW1}$ and $V_{SW2}$. The buffer circuit 222 converts the first logic signal $V_{LOG1}$ into the first switching driving signal $V_{SW1}$, and converts the second logic signal $V_{LOG2}$ into the second switching driving signal $V_{SW2}$. Since the first logic signal $V_{LOG1}$ and the second logic signal $V_{LOG2}$ are logic signals, current levels thereof are low. Accordingly, the buffer circuit 222 converts the first logic signal $V_{LOG1}$ and the second logic signal $V_{LOG2}$ into the first switching driving signal $V_{SW1}$ and the second switching driving signal $V_{SW2}$ having high current levels, respectively. Meanwhile, the buffer circuit 222 may further include a level shifter circuit as well as a buffer to increase a voltage level as well as a current level. The buffer circuit 222 according to the embodiment receives the highest voltage $V_{HIGH}$ selected by the voltage selector 230, and generates the first and second switching driving signals $V_{SW1}$ and $V_{SW2}$ by using the highest voltage $V_{HIGH}$. When the first and second switching driving signals $V_{SW1}$ and $V_{SW2}$ have a high voltage level, the first and second switching driving signals $V_{SW1}$ and $V_{SW2}$ are the highest voltage $V_{HIGH}$. When the first and second switches SW1 and SW2 are implemented as p-type transistors, the buffer circuit 222 may output the first and second switching driving signals $V_{SW1}$ and $V_{SW2}$ having the highest voltage $V_{HIGH}$ as an OFF driving signal. In this case, the first and second switches SW1 and SW2 are turned off. When the first and second switches SW1 and SW2 are implemented as n-type transistors, the buffer circuit 222 may output the first and second switching driving signals $V_{SW1}$ and $V_{SW2}$ having the highest voltage $V_{HIGH}$ as an ON driving signal. In this case, the first and second switches SW1 and SW2 are turned on. A method in which the buffer circuit 222 generates the first and second switching driving signals $V_{SW1}$ and $V_{SW2}$ by using the highest voltage $V_{HIGH}$ is well known to those of ordinary skill in the art to which the present disclosure pertains, so a detailed description thereof will be omitted.

As shown in FIG. 5, in the switch circuit 210, the first and second switches SW1 and SW2 may be implemented as p-type transistors 211a and 212a, respectively. As an example, the first switch SW1 may be implemented as a p-type FET 211a, and the second switch SW2 may be implemented as a p-type FET 212a.

A source of the p-type FET 211a is connected to the first power supply circuit 100a to receive (be supplied with) the first power supply voltage VCC1, and a drain of the p-type FET 211a is connected to the power supply terminal T_VCC. A gate of the p-type FET 211a receives the first switching driving signal $V_{SW1}$ from the buffer circuit 222. To turn off the p-type FET 211a, the buffer circuit 222 outputs the highest voltage $V_{HIGH}$ inputted from the voltage selector 230 as the first switching driving signal $V_{SW1}$, through which the p-type FET 211a may be sufficiently turned off. When a gate voltage of the p-type FET 211a is lower than a source voltage or a drain voltage thereof, the p-type FET 211a is not sufficiently turned off, and thus, a leakage current may occur. In order to solve this problem, the voltage selector 230 selects the highest voltage $V_{HIGH}$ from the used power supply voltages and outputs it to the buffer circuit 222, and the buffer circuit 222 generates the highest voltage $V_{HIGH}$ as a control voltage of the p-type FET 211a. That is, the highest voltage $V_{HIGH}$ may be an OFF control voltage of the p-type FET 211a.

Figure 8:
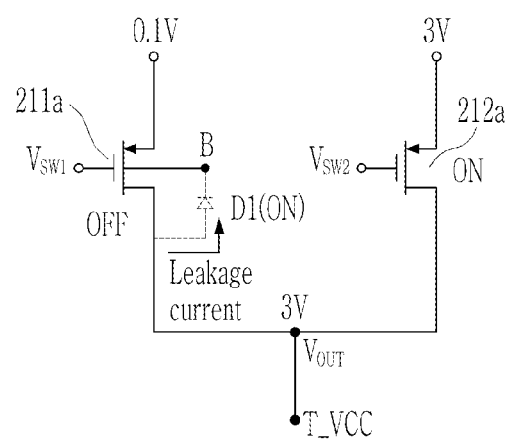
FIG. 8 illustrates an example in which a leakage current occurs to a body terminal of a p-type FET.

In addition, in order to prevent a leakage current to the body terminal of the p-type FET 211a, the highest voltage $V_{HIGH}$ selected by the voltage selector 230 may be applied to the body terminal of the p-type FET 211a. FIG. 8 illustrates an example in which a leakage current occurs to the body terminal of the p-type FET. In FIG. 8, it is assumed that the first power supply voltage VCC1 is 0.1 V, the second power supply voltage VCC2 is 3 V, the p-type FET 211a is turned off, and the p-type FET 212a is turned on. Since the p-type FET 211a is turned off and the p-type FET 212a is turned on, the power supply terminal voltage $V_{OUT}$ becomes 3 V. Due to the characteristics of the p-type FET 211a, a PN diode D1 of connection structure may be formed between the drain (or source) and the body terminal B. Here, since the drain voltage of the p-type FET 211a is 3 V, the PN diode D1 formed between the drain and the body terminal of the p-type FET 211a is turned on. Accordingly, a leakage current may be formed toward the body terminal B of the p-type FET 211a. However, as shown in FIG. 5, when the highest voltage $V_{HIGH}$ (for example, 3 V, which is the second power supply voltage VCC2), is applied to the body terminal of the p-type FET 211a, the PN diode D1 is turned off, and accordingly, no leakage current may be formed.

A source of the p-type FET 212a is connected to the second power supply circuit 100b to receive (be supplied with) the second power supply voltage VCC2, and a drain of the p-type FET 212a is connected to the power supply terminal T_VCC. A gate of the p-type FET 212a receives the second switching driving signal $V_{SW2}$ from the buffer circuit 222. To turn off the p-type FET 212a, the buffer circuit 222 outputs the highest voltage $V_{HIGH}$ inputted from the voltage selector 230 as the second switching driving signal $V_{SW2}$, through which the p-type FET 212a may be sufficiently turned off. When a gate voltage of the p-type FET 212a is lower than a source voltage or a drain voltage thereof, the p-type FET 212a is not sufficiently turned off, and thus, a leakage current may occur. In order to solve this problem, the voltage selector 230 selects the highest voltage $V_{HIGH}$ from the used power supply voltages and outputs it to the buffer circuit 222, and the buffer circuit 222 generates the highest voltage $V_{HIGH}$ as a control voltage of the p-type FET 212a. That is, the highest voltage $V_{HIGH}$ may be an OFF control voltage of the p-type FET 212a. In addition, in order to prevent a leakage current to the body terminal of the p-type FET 212a, the highest voltage $V_{HIGH}$ selected by the voltage selector 230 is also applied to the body terminal of the p-type FET 212a.

As described with reference to FIG. 3A, as an example, the voltage selector 230 receives the first power supply voltage VCC1 or the second power supply voltage VCC2, and the driving power supply voltage VBAT, and may select and output the highest voltage $V_{HIGH}$ among them. In addition, as another example, the voltage selector 230 may receive the first power supply voltage VCC1, the second power supply voltage VCC2, and the driving power supply voltage VBAT, and may select and output the highest voltage $V_{HIGH}$ among them. In other words, the voltage selector 230 may receive at least one of the two power supply voltages VCC1 and VCC2 and the driving power supply voltage, and may select and output the highest voltage $V_{HIGH}$ among them. Meanwhile, as described above with reference to FIG. 1, each of the first and second power supply voltages VCC1 and VCC2 may vary according to an envelope of an input RF signal to support an average power tracking mode (APT mode). The voltage selector 230 may output the highest voltage $V_{HIGH}$ by comparing the varying power supply voltage VCC1 or VCC2 with the driving power supply voltage VBAT. Here, the driving power supply voltage VBAT may not vary.

Figure 9:
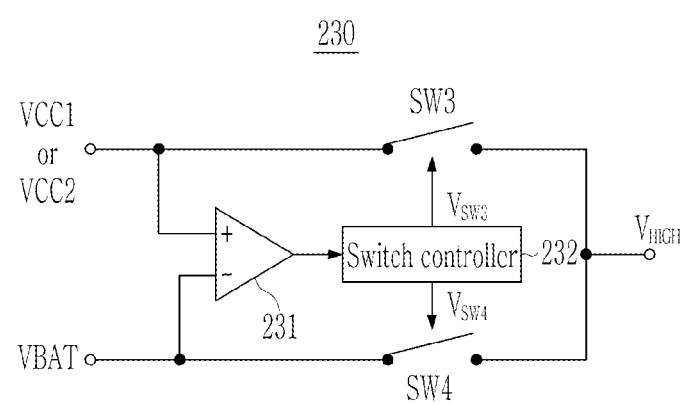
FIG. 9 illustrates an inner configuration of a voltage selector according to an embodiment.

FIG. 9 illustrates an inner configuration of a voltage selector 230 according to an embodiment.

As shown in FIG. 9, the voltage selector 230 according to the embodiment may include a first comparator 231, a switch controller 232, a third switch SW3, and a fourth switch SW4. The voltage selector 230 of FIG. 9 receives the first power supply voltage VCC1 or the second power supply voltage VCC2, and the driving power supply voltage VBAT, and selects and outputs the highest voltage $V_{HIGH}$ among them.

The first power supply voltage VCC1 or the second power supply voltage VCC2 may be inputted to a non-inverting terminal (+) of the first comparator 231, and the driving power supply voltage VBAT may be inputted to an inverting terminal (−) of the first comparator 231. The first comparator 231 compares the first power supply voltage VCC1 or the second power supply voltage VCC2 with the driving power supply voltage VBAT. The first comparator 231 outputs a high signal when the first power supply voltage VCC1 or the second power supply voltage VCC2 is higher than the driving power supply voltage VBAT as a compared result. In addition, the first comparator 231 outputs a low signal when the driving power supply voltage VBAT is higher than the first power supply voltage VCC1 or the second power supply voltage VCC2 as a compared result.

The switch controller 232 receives an output of the first comparator 231 and generates a switching driving signal in response to the output of the first comparator 231. Here, the switching driving signal may include a third switching driving signal $V_{SW3}$ that controls switching of the third switch SW3 and a fourth switching driving signal $V_{SW4}$ that controls switching of the fourth switch SW4. The third switching driving signal $V_{SW3}$ is outputted to the third switch SW3, and the fourth switching driving signal $V_{SW4}$ is outputted to the fourth switch SW4. When the output of the first comparator 231 is a high signal (that is, when the first power supply voltage VCC1 or the second power supply voltage VCC2 is higher than the driving power supply voltage VBAT), the switch controller 232 generates and outputs the third switching driving signal $V_{SW3}$ that turns on the third switch SW3. When the output of the first comparator 231 is a low signal (that is, when the driving power supply voltage VBAT is higher than the first power supply voltage VCC1 or the second power supply voltage VCC2), the switch controller 232 generates and outputs the fourth switching driving signal $V_{SW4}$ that turns on the fourth switch SW4.

The third switch SW3 is connected between a terminal to which the first power supply voltage VCC1 or the second power supply voltage VCC2 is applied and a terminal that outputs the highest voltage $V_{HIGH}$, and switches the first power supply voltage VCC1 or the second power supply voltage VCC2. In addition, the fourth switch SW4 is connected between a terminal to which the driving power supply voltage VBAT is applied and the terminal that outputs the highest voltage $V_{HIGH}$, and switches the driving power supply voltage VBAT. The third switch SW3 is controlled by the third switching driving signal $V_{SW3}$, and the fourth switch SW4 is controlled by the fourth switching driving signal $V_{SW4}$.

When the first power supply voltage VCC1 or the second power supply voltage VCC2 is higher than the driving power supply voltage VBAT, the first comparator 231 outputs a high signal. The switch controller 232 corresponds to the high signal of the first comparator 231 to generate the third and fourth switching driving signals $V_{SW3}$ and $V_{SW4}$. Here, the third switching driving signal $V_{SW3}$ is an ON driving signal, and the fourth switching driving signal $V_{SW4}$ is an OFF driving signal. Accordingly, the third switch SW3 is turned on and the fourth switch SW4 is turned off, so that the first power supply voltage VCC1 or the second power supply voltage VCC2 is outputted as the highest voltage $V_{HIGH}$.

When the driving power supply voltage VBAT is higher than the first power supply voltage VCC1 or the second power supply voltage VCC2, the first comparator 231 outputs a low signal. The switch controller 232 corresponds to the low signal of the first comparator 231 to generate the third and fourth switching driving signals $V_{SW3}$ and $V_{SW4}$. Here, the third switching driving signal $V_{SW3}$ is an OFF driving signal, and the fourth switching driving signal $V_{SW4}$ is an ON driving signal. Accordingly, the third switch SW3 is turned off and the fourth switch SW4 is turned on, so that the driving power supply voltage VBAT is outputted as the highest voltage $V_{HIGH}$.

Figure 10:
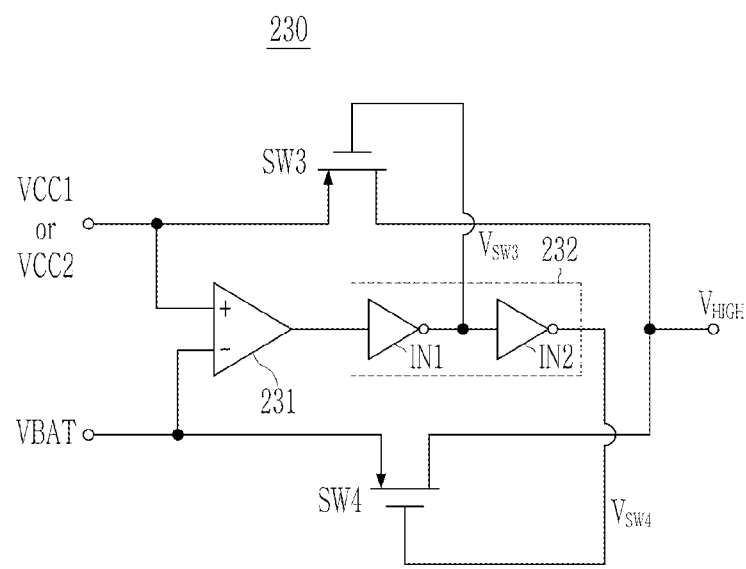
FIG. 10 specifically illustrates an inner configuration of a switch controller of FIG. 9.

FIG. 10 specifically illustrates an inner configuration of the switch controller 232 of FIG. 9.

As shown in FIG. 10, the switch controller 232 may include a first inverter IN1 and a second inverter IN2. Each of the third and fourth switches SW3 and SW4 may be a p-type transistor.

An input terminal of the first inverter IN1 is connected to an output terminal of the first comparator 231, and an output terminal of the first inverter IN1 is connected to a control terminal of the third switch SW3. An input terminal of the second inverter IN2 is connected to an output terminal of the first inverter IN1, and an output terminal of the second inverter IN2 is connected to a control terminal of the fourth switch SW4.

A first terminal (for example, source terminal) of the third switch SW3 is connected to a terminal to which the first power supply voltage VCC1 or the second power supply voltage VCC2 is applied, and a second terminal (for example, drain terminal) of the third switch SW3 is connected to a terminal that outputs the highest voltage $V_{HIGH}$, and the control terminal of the third switch SW3 is connected to the output terminal of the first inverter IN1.

A first terminal (for example, source terminal) of the fourth switch SW4 is connected to a terminal to which the driving power supply voltage VBAT is applied, and a second terminal (for example, drain terminal) of the fourth switch SW4 is connected to a terminal that outputs the highest voltage $V_{HIGH}$, and the control terminal of the fourth switch SW4 is connected to the output terminal of the second inverter IN2.

When the first comparator 231 outputs a high signal, the first inverter IN1 outputs a low signal. Since the third switch SW3 is a p-type transistor, the third switch SW3 is turned on by the low signal of the first inverter IN1. In this case, since the second inverter IN2 outputs a high signal, the fourth switch SW4 is turned off.

When the first comparator 231 outputs a low signal, the first inverter IN1 outputs a high signal. In addition, since the third switch SW3 is a p-type transistor, the third switch SW3 is turned off by the high signal of the first inverter IN1. In this case, since the second inverter IN2 outputs a low signal, the fourth switch SW4 is turned on.

Meanwhile, FIG. 10 illustrates the case in which the third and fourth switches SW3 and SW4 are the p-type transistors, but they may be n-type transistors. When the third and fourth switches SW3 and SW4 are n-type transistors, the switch controller 232 may be implemented with an odd number of inverters instead of an even number of inverters. In addition, in FIG. 9 and FIG. 10, the power supply voltages inputted to the first comparator 231 may be exchanged. That is, the driving power supply voltage VBAT may be inputted to the non-inverting terminal (+) of the first comparator 231, and the first power supply voltage VCC1 or the second power supply voltage VCC2 is inputted to the inverting terminal (−) of the comparator 231.

Figure 11:
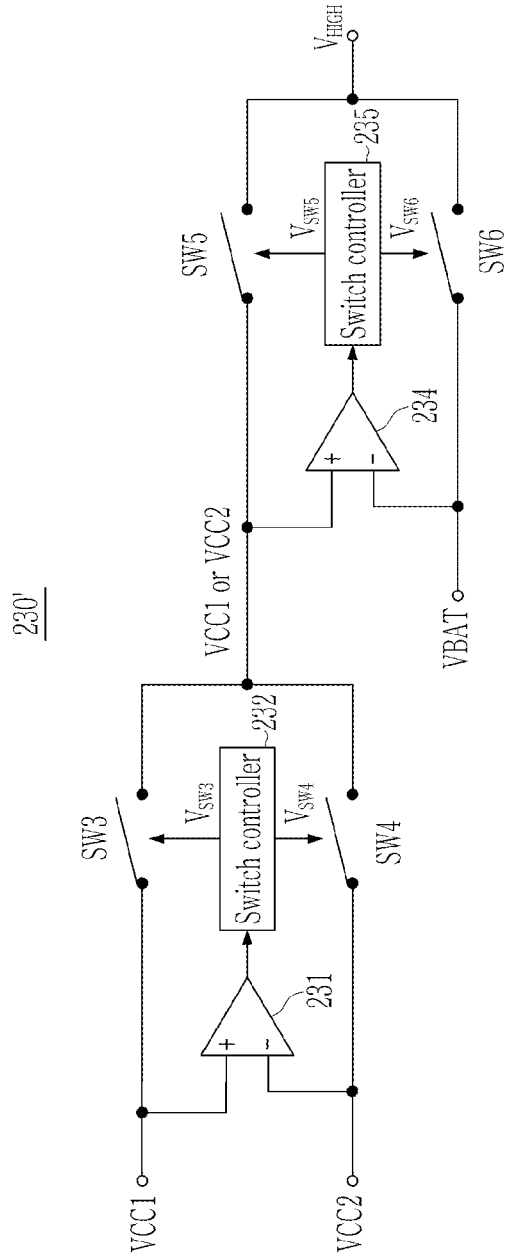
FIG. 11 illustrates an inner configuration of a voltage selector according to another embodiment.

FIG. 11 illustrates an inner configuration of a voltage selector 230' according to another embodiment.

As shown in FIG. 11, the voltage selector 230' according to the present embodiment may include a first comparator 231, a switch controller 232, a third switch SW3, a fourth switch SW4, a second comparator 234, a switch controller 235, a fifth switch SW5, and a sixth switch SW6. The voltage selector 230' of FIG. 11 receives the first power supply voltage VCC1, the second power supply voltage VCC2, and the driving power supply voltage VBAT, and selects and outputs the highest voltage $V_{HIGH}$ among them.

A circuit (hereinafter, referred to as a 'first selection circuit') including the first comparator 231, the switch controller 232, the third switch SW3, and the fourth switch SW4 is similar to the voltage selector 230 of FIG. 9. However, the first power supply voltage VCC1 is inputted to the non-inverting terminal (+) of the first comparator 231, and the second power supply voltage VCC2 is inputted to the inverting terminal (−) of the first comparator 231. Accordingly, the first selection circuit outputs a higher power supply voltage VCC1 or VCC2 among the first power supply voltage VCC1 and the second power supply voltage VCC1.

A circuit (hereinafter, referred to as a 'second selection circuit') including the second comparator 234, the switch controller 235, the fifth switch SW5, and the sixth switch SW6 is similar to the voltage selector 230 of FIG. 9. However, the output voltage of the first selection circuit (that is, a higher voltage among the first power supply voltage VCC1 and the second power supply voltage VCC2) is inputted to the non-inverting terminal (+) of the second comparator 234, and the driving power supply voltage VBAT is inputted to the inverting terminal (−) of the second comparator 234. The switch controller 235 receives an output of the second comparator 234, and generates a switching driving signal in response to the output of the second comparator 234. Here, the switching driving signal may include a fifth switching driving signal $V_{SW5}$ that controls switching of the fifth switch SW5 and a sixth switching driving signal $V_{SW6}$ that controls switching of the sixth switch SW6. The fifth switching driving signal $V_{SW5}$ is outputted to the fifth switch SW5, and the sixth switching driving signal $V_{SW6}$ is outputted to the sixth switch SW6. Through this configuration, the second selection circuit outputs the highest voltage $V_{HIGH}$ among the voltage (the higher voltage among VCC1 and VCC2) selected by the first selection circuit and the driving power supply voltage VBAT. That is, the second selection circuit selects and outputs the highest voltage $V_{HIGH}$ among the first power supply voltage VCC1, the second power supply voltage VCC2, and the driving power supply voltage VBAT.

Figure 12:
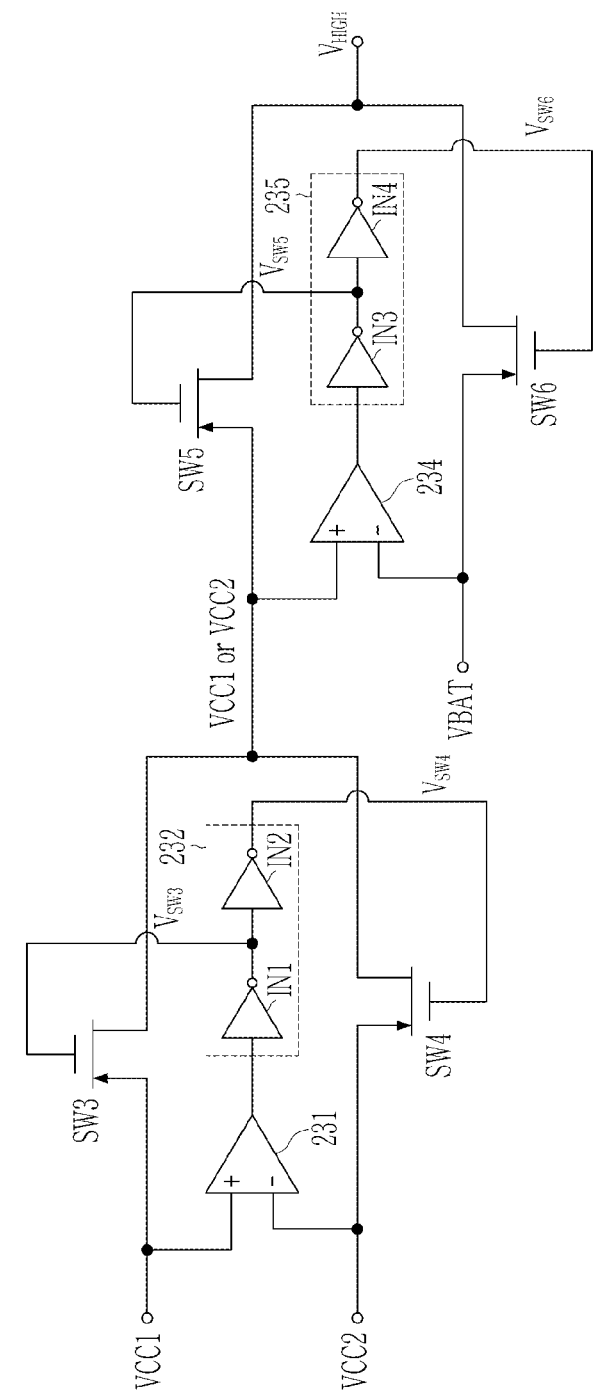
FIG. 12 specifically illustrates inner configurations of a switch controller 232 and a switch controller 235 of FIG. 11.

FIG. 12 specifically illustrates inner configurations of the switch controller 232 and the switch controller 235 of FIG. 11.

The switch controller 232 of FIG. 11 has the same configuration as the switch controller 232 of FIG. 10, and an operation thereof is the same as that of the switch controller 232 of FIG. 10, so a detailed description thereof will be omitted. The switch controller 235 may include a third inverter IN3 and a fourth inverter IN4. Each of the fifth and sixth switches SW5 and SW6 may be a p-type transistor.

An input terminal of the third inverter IN3 is connected to the output terminal of the second comparator 234, and an output terminal of the third inverter IN3 is connected to the control terminal of the fifth switch SW5. An input terminal of the fourth inverter IN4 is connected to the output terminal of the third inverter IN3, and an output terminal of the fourth inverter IN4 is connected to the control terminal of the sixth switch SW6.

A first terminal (for example, source terminal) of the fifth switch SW5 is connected to the output terminal of the first selection circuit, a second terminal (for example, drain terminal) of the fifth switch SW5 is connected to a terminal that outputs the highest voltage $V_{HIGH}$, and a control terminal of the fifth switch SW5 is connected to the output terminal of the third inverter IN3.

A first terminal (for example, source terminal) of the sixth switch SW6 is connected to a terminal to which the driving power supply voltage VBAT is applied, a second terminal (for example, drain terminal) of the sixth switch SW6 is connected to a terminal that outputs the highest voltage $V_{HIGH}$, and a control terminal of the sixth switch SW6 is connected to the output terminal of the fourth inverter IN4.

Meanwhile, FIG. 12 illustrates the case in which the fifth and sixth switches SW5 and SW6 are the p-type transistors, but they may be n-type transistors. When the fifth and sixth switches SW5 and SW6 are n-type transistors, the switch controller 235 may be implemented with an odd number of inverters instead of an even number of inverters. In addition, in FIG. 11 and FIG. 12, the power supply voltages inputted to the first and second comparators 231 and 234, respectively, may be exchanged within the first power supply voltage VCC1, the second power supply voltage VCC2, and the driving power supply voltage VBAT.

Figure 13:
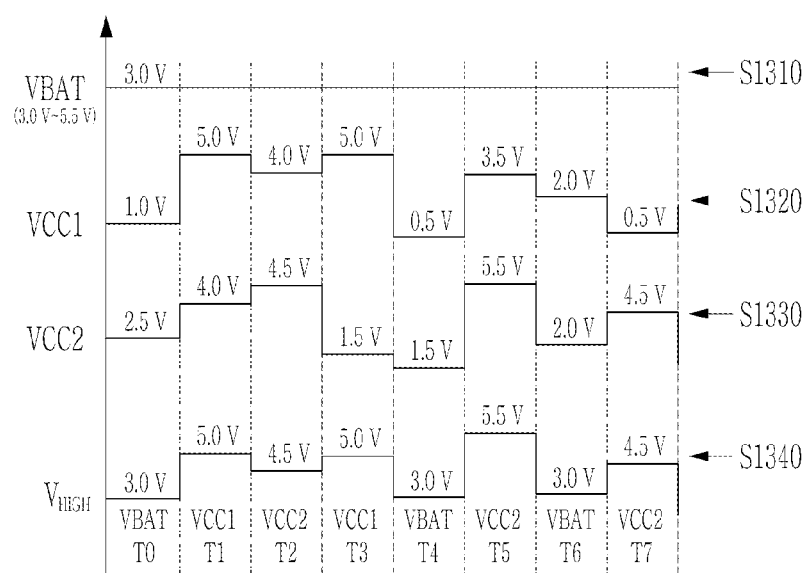
FIG. 13 illustrates an example of a case in which a highest voltage ($V_{HIGH}$) is selected.

FIG. 13 illustrates an example of a case in which the highest voltage $V_{HIGH}$ is selected.

FIG. 13 illustrates an example in which the voltage selector 230 selects the highest voltage $V_{HIGH}$ among the first power supply voltage VCC1, the second power supply voltage VCC2, and the driving power supply voltage VBAT. The driving power supply voltage VBAT may substantially be within a range of 3.0 V to 5.5 V, but it is assumed to be 3 V. In order to support an APT mode, since the first power supply voltage VCC1 may vary according to an envelope of an input RF signal, it is assumed that it varies as in S1320. In order to support an APT mode, since the second power supply voltage VCC2 may also vary according to an envelope of an input RF signal, it is assumed that it varies as in S1330.

Since the driving power supply voltage VBAT is the highest voltage in a period T0, the driving power supply voltage VBAT is selected as the highest voltage $V_{HIGH}$. In addition, since the first power supply voltage VCC1 is the highest voltage $V_{HIGH}$ in a period T1, the first power supply voltage VCC1 is selected as the highest voltage $V_{HIGH}$. Accordingly, the highest voltage $V_{HIGH}$ may be selected as in S1340.

Meanwhile, although FIG. 13 illustrates the case in which the highest voltage $V_{HIGH}$ is selected among the three voltages VCC1, VCC2, and VBAT, the highest voltage $V_{HIGH}$ may be selected among the two voltages VCC1 and VBAT or VCC2 and VBAT as described above.

Figure 14:
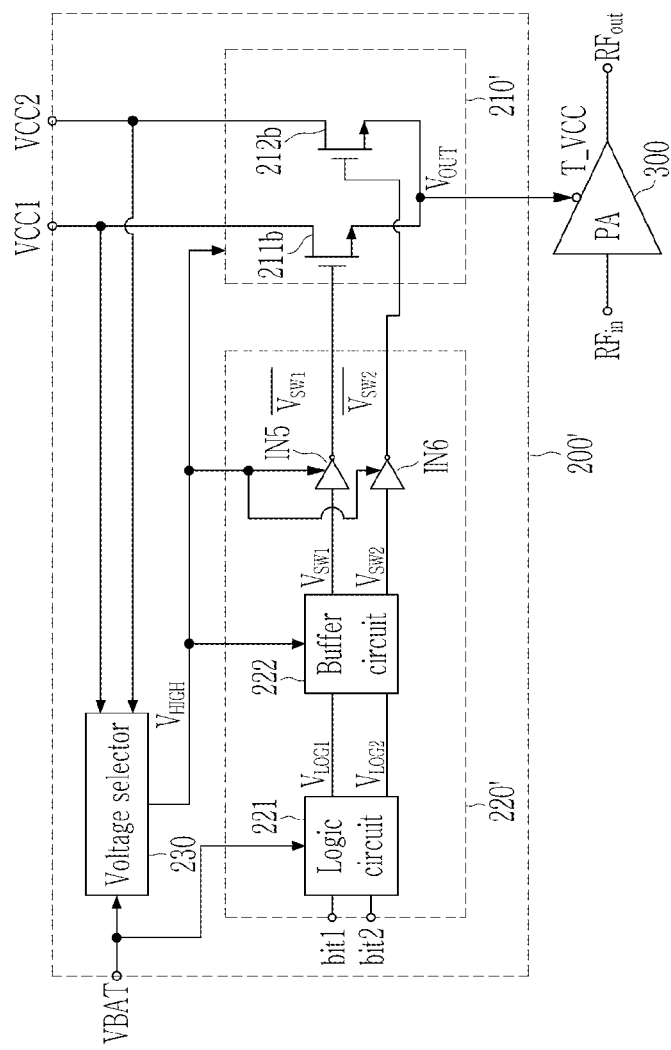
FIG. 14 illustrates a power supply switch circuit according to another embodiment.

FIG. 14 illustrates a power supply switch circuit 200' according to another embodiment.

As shown in FIG. 14, the power supply switch circuit 200' according to the present embodiment may include a switch circuit 210', a switch controller 220', and a voltage selector 230.

In the switch circuit 210' according to the present embodiment, the first switch SW1 may be implemented as an n-type transistor 211b, and the second switch SW2 may be implemented as an n-type transistor 212b. That is, the first switch SW1 may be implemented as an n-type FET 211b, and the second switch SW2 may be implemented as an n-type FET 212b.

The switch controller 220' according to the present embodiment may include a logic circuit 221, a buffer circuit 222, a fifth inverter IN5, and a sixth inverter IN6. The switch controller 220' according to the present embodiment is the same as the switch controller 220 of FIG. 5 except that it further includes the fifth inverter IN5 and the sixth inverter IN6, so a duplicate description will be omitted. Meanwhile, the fifth and sixth inverters IN5 and IN6 may be implemented by being included in the buffer circuit 222.

The fifth inductor IN5 receives a first switching driving signal $V_{SW1}$ of the buffer circuit 222 to output an inverted switching driving signal ($\overline{V_{SW1}}$). Since the first switch SW1 is the n-type transistor 211b, the first switching driving signal $V_{SW}$ is inverted by the fifth inverter IN5. The inverted switching driving signal ($\overline{V_{SW1}}$) is inputted to the control terminal of the n-type transistor 211b. In addition, the fifth inverter IN5 may receive the highest voltage $V_{HIGH}$ to be biased, and may output the inverted switching driving signal ($\overline{V_{SW1}}$) with the highest voltage $V_{HIGH}$ as an ON driving signal.

The sixth inductor IN6 receives a second switching driving signal $V_{SW2}$ of the buffer circuit 222 to output an inverted switching driving signal ($\overline{V_{SW2}}$). Since the second switch SW2 is the n-type transistor 212b, the second switching driving signal $V_{SW2}$ is inverted by the sixth inverter IN6. The inverted switching driving signal ($\overline{V_{SW2}}$) is inputted to the control terminal of the n-type transistor 212b. In addition, the sixth inverter IN6 may also receive the highest voltage $V_{HIGH}$ to be biased, and may output the inverted switching driving signal ($\overline{V_{SW2}}$) with the highest voltage $V_{HIGH}$ as an ON driving signal.

A drain of the n-type FET 211b is connected to the first power supply circuit 100a to receive (be supplied with) the first power supply voltage VCC1, and a source of the n-type FET 211b is connected to the power supply terminal T_VCC. A gate of the n-type FET 211b receives the inverted switching driving signal ($\overline{V_{SW1}}$) through the buffer circuit 222 and the fifth inverter IN5. For turn-on of the n-type FET 211b, the buffer circuit 222 and the fifth inverter IN5 output the highest voltage $V_{HIGH}$ as the inverted switch driving signal ($\overline{V_{SW1}}$), through which the n-type FET 211b may be sufficiently turned on. When the gate voltage of the n-type FET 211b is lower than the source or drain voltage thereof, the n-type FET 211b operates in a turn-off region, so that ON resistance thereof may increase. To solve this problem, the voltage selector 230 selects the highest voltage $V_{HIGH}$ to output it to the buffer circuit 222 and the fifth inverter IN5, and the buffer circuit 222 and the fifth inverter IN5 generate the highest voltage $V_{HIGH}$ as the control voltage of the n-type FET 211b. That is, the highest voltage $V_{HIGH}$ may be an ON control voltage of the n-type FET 211b.

A drain of the n-type FET 212b is connected to the second power supply circuit 100b to receive (be supplied with) the second power supply voltage VCC2, and a source of the n-type FET 212b is connected to the power supply terminal T_VCC. A gate of the n-type FET 212b receives the inverted switching driving signal ($\overline{V_{SW2}}$) through the buffer circuit 222 and the sixth inverter IN6. For turn-on of the n-type FET 212b, the buffer circuit 222 and the sixth inverter IN6 output the highest voltage $V_{HIGH}$ as the inverted switch driving signal ($\overline{V_{SW2}}$), through which the n-type FET 212b may be sufficiently turned on. When the gate voltage of the n-type FET 212b is lower than the source or drain voltage thereof, the n-type FET 212b operates in a turn-off region, so that ON resistance thereof may increase. To solve this problem, the voltage selector 230 selects the highest voltage $V_{HIGH}$ to output it to the buffer circuit 222 and the sixth inverter IN6, and the buffer circuit 222 and the sixth inverter IN6 generate the highest voltage $V_{HIGH}$ as the control voltage of the n-type FET 212b. That is, the highest voltage $V_{HIGH}$ may be an ON control voltage of the n-type FET 212b.

Figure 15:
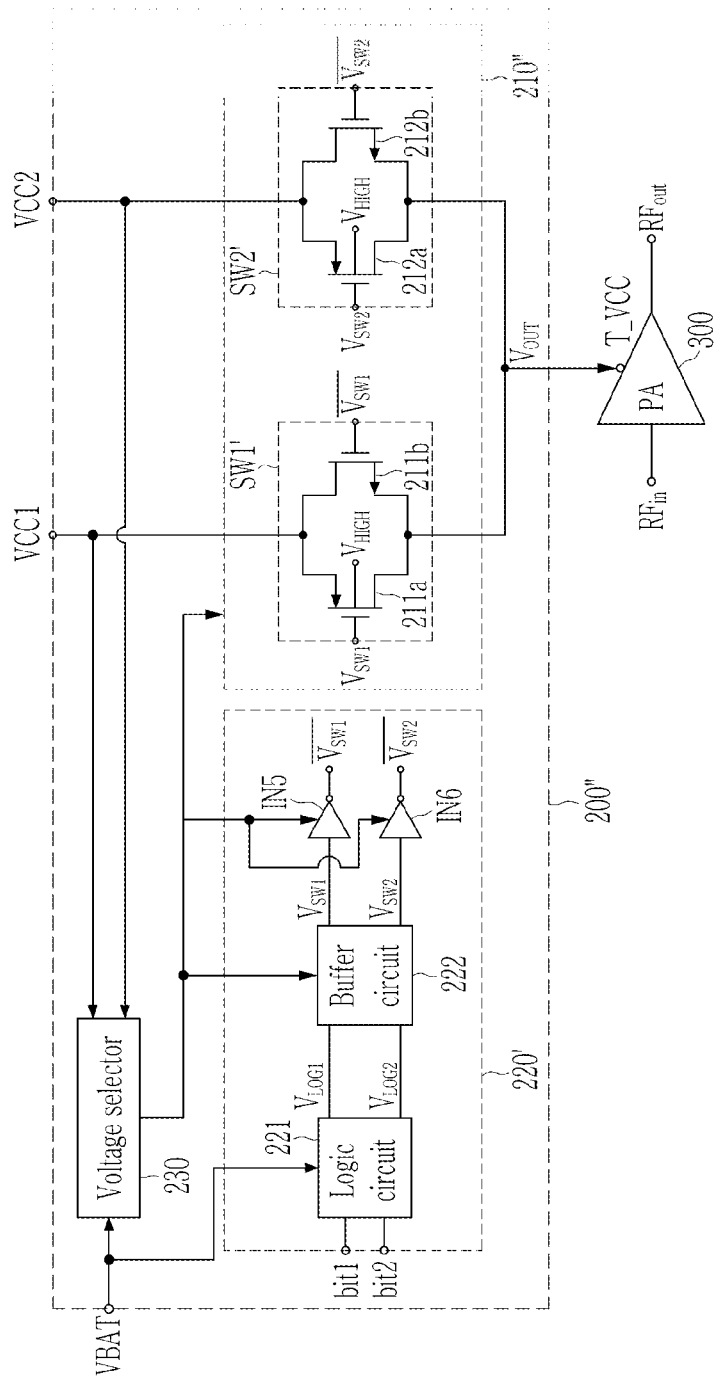
FIG. 15 illustrates a power supply switch circuit according to another embodiment.

FIG. 15 illustrates a power supply switch circuit 200" according to another embodiment.

As shown in FIG. 15, the power supply switch circuit 200" according to the present embodiment may include a switch circuit 210", a switch controller 220', and a voltage selector 230. In addition, the power supply switch circuit 200" according to the present embodiment is similar to the power supply switch circuit 200 of FIG. 5 and the switch supply circuit 200' of FIG. 14 except that the implementation of the first and second switches is changed, so a redundant description will be omitted.

In addition, the switch circuit 210" according to the present embodiment may include a first switch SW1' and a second switch SW2'. The first and second switches SW1' and SW2' are configured as a p-type transistor and an n-type transistor connected in parallel to each other, respectively. That is, the first and second switches SW1' and SW2' may be implemented as a p-type FET and an n-type FET connected in parallel to each other, respectively. The first switch SW1' includes a p-type transistor 211a and an n-type transistor 211b connected in parallel to each other, and the second switch SW2' includes a p-type transistor 212a and an n-type transistor 212b connected in parallel to each other. In the first switch SW1', a drain of the n-type transistor 211b and a source of the p-type transistor 211a are connected to each other, and are commonly connected to the first power supply voltage VCC1. In addition, in the first switch SW1', a source of the n-type transistor 211b and a drain of the p-type transistor 211a are connected to each other, and are commonly connected to the power supply terminal T_VCC. In the second switch SW2', a drain of the n-type transistor 212b and a source of the p-type transistor 212a are connected to each other, and are commonly connected to the second power supply voltage VCC2. In addition, in the second switch SW2', a source of the n-type transistor 212b and a drain of the p-type transistor 212a are connected to each other, and are commonly connected to the power supply terminal T_VCC.

As shown in FIG. 15, the first switching driving signal $V_{SW1}$ that is the output of the buffer circuit 222 is applied to a control terminal of the p-type transistor 211a, and the second switching driving signal $V_{SW2}$ that is the output of the buffer circuit 222 is applied to a control terminal of the p-type transistor 212a. In addition, in order to prevent a leakage current, the highest voltage $V_{HIGH}$ is applied to body terminals of the two p-type transistors 211a and 212a, respectively. In addition, the inverted switching driving signal ($\overline{V_{SW1}}$) that is the output of the fifth inverter IN5 is applied to a control terminal of the n-type transistor 211b, and the inverted switching driving signal ($\overline{V_{SW2}}$) that is the output of the sixth inverter IN6 is applied to a control terminal of the n-type transistor 212b. Accordingly, the p-type transistor 211a and the n-type transistor 211b configuring the first switch SW1' may be simultaneously turned on and turned off, and the p-type transistor 212a and the n-type transistor 212b configuring the second switch SW2' may be simultaneously turned on and turned off.

As described above, the first and second power supply voltages VCC1 and VCC2 may vary according to an envelope of an input RF signal to support the APT mode. Accordingly, the first and second power supply voltages VCC1 and VCC2 may have a wide voltage range. It is necessary to maintain switch turn-on resistance to be low even at power supply voltages having a wide voltage range, and to this end, as shown in FIG. 15, the first and second switches SW1' and SW2' may be respectively configured of an n-type transistor and a p-type transistor connected in a parallel structure.

Figure 16:
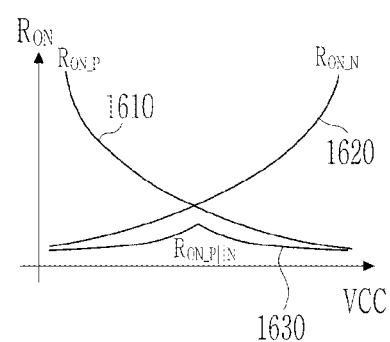
FIG. 16 illustrates a graph of turn-on resistance (RON) of a transistor according to a power supply voltage VCC.

FIG. 16 illustrates a graph of turn-on resistance RON of a transistor according to a power supply voltage VCC.

In FIG. 16, reference numeral 1610 denotes a turn-on resistance of a p-type transistor (for example, p-type FET) according to the power supply voltage VCC, and reference numeral 1620 denotes a turn-on resistance of an n-type transistor (for example, n-type FET) according to the power supply voltage VCC. Referring to 1610, the turn-on resistance of the p-type transistor increases as the power supply voltage VCC decreases. That is, as shown in FIG. 5, when a switch is configured only with a p-type transistor, the turn-on resistance may be large at a low power supply voltage VCC. For this reason, a high voltage drop occurs high in the switch (p-type transistor), and power consumption increases. Meanwhile, referring to 1620, the turn-on resistance of the n-type transistor increases as the power supply voltage VCC increases. That is, as shown in FIG. 14, when a switch is configured only with an n-type transistor, the turn-on resistance may be large at a high power supply voltage VCC.

In order to maintain a low turn-on resistance even at a wide power supply voltage, as shown in FIG. 15, the first and second switches SW1' and SW2' may be configured with an n-type transistor and a p-type transistor connected in parallel to each other, respectively. In FIG. 16, reference numeral 1630 denotes a turn-on resistance according to the power supply voltage VCC when a switch is configured of an n-type transistor and a p-type transistor connected in parallel to each other. Referring to 1630, the turn-on resistance may be maintained to be low even at a wide power supply voltage (input voltage). Here, in the case in which the switches SW1' and SW2' are each configured of a p-type transistor and an n-type transistor, the n-type transistor may mainly operate when the power supply voltage (input voltage) is low, and the p-type transistor may mainly operate when the power supply voltage is high.

Figure 17:
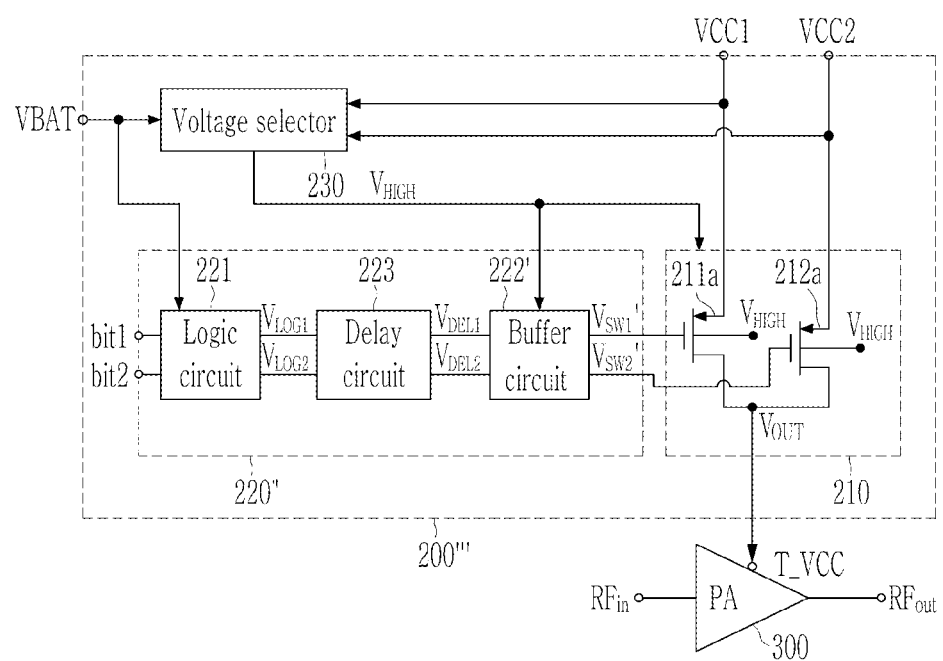
FIG. 17 illustrates a power supply switch circuit according to another embodiment.

FIG. 17 illustrates a power supply switch circuit 200''' according to another embodiment.

The power supply switch circuit 200''' according to the present embodiment, when selecting the second power supply voltage VCC2 to apply it to the power supply terminal T_VCC instead of the case of selecting the first power supply voltage VCC1 to apply it to the power supply terminal T_VCC, may generate a switching control signal so as to instantaneously overlap the two power supply voltages VCC1 and VCC2. Alternatively, the power supply switch circuit 200''', when selecting the first power supply voltage VCC1 to apply it to the power supply terminal T_VCC instead of the case of selecting the second power supply voltage VCC2 to apply it to the power supply terminal T_VCC, may generate a switching control signal so as to instantaneously overlap the two power supply voltages VCC1 and VCC2. That is, the power supply switch circuit 200''' generates a control signal so that the power supply voltage may be continuously supplied to the power supply terminal (T_VCC) of the power amplifier 300 when switching between two power supply voltages. This is described from the switch point of view as follows. When the first switch SW1 is changed from an ON state to an OFF state and the second switch SW2 is changed from an OFF state to an ON state, the switch controller 220'' generates a period (hereinafter, referred to as an 'overlapping-on period') in which the first switch SW1 and the second switch SW2 are simultaneously turned on by delaying the turn-off of the first switch SW1. In addition, even when the second switch SW2 is changed from the ON state to the OFF state and the first switch SW1 is changed from the OFF state to the ON state, the switch controller 220'' generates the overlapping-on period by delaying the turn-off of the second switch SW2. Through this overlapping-on period, the power supply voltage may be provided to the power amplifier without interruption. When there is no overlapping-on period, the power supply voltage is cut off and the power amplifier 300 may be turned off, which may cause a call drop in an electronic device including the power amplifier 300. When the overlap-on period is set as in the present embodiment described above, the call drop of the electronic device may be prevented.

Meanwhile, when the switch controller 220'' according to the present embodiment turns on one switch SW1 or SW2 in the state that both the first and second switches SW1 and SW2 are turned off (for example, bit signals 00 and 11), the overlapping-on period in which the first switch SW1 and the second switch SW2 are simultaneously turned on may not be generated.

As shown in FIG. 17, the power supply switch circuit 200''' according to the present embodiment may include the switch circuit 210, a switch controller 220'', and the voltage selector 230. The power supply switch circuit 200''' according to the present embodiment is similar to the power supply switch circuit 200 of FIG. 5 except that the switch controller 220'' further includes a delay circuit 223, so a redundant description thereof will be omitted.

As shown in FIG. 17, the switch controller 220'' according to the present embodiment may include the logic circuit 221, the delay circuit 223, and a buffer circuit 222'. The switch controller 220'' is similar to the switch controller 220 of FIG. 5 except that it further includes the delay circuit 223, so a redundant description thereof will be omitted.

The delay circuit 223 receives the first and second logic signals $V_{LOG1}$ and $V_{LOG2}$ from the logic circuit 221, and outputs delay signals $V_{DEL1}$ and $V_{DEL2}$ so that the overlapping-on period is generated when the first switch SW1 and the second switch SW2 are switched. The first delay signal $V_{DEL1}$ corresponds to the first logic signal $V_{LOG1}$, and the second delay signal $V_{DEL2}$ corresponds to the second logic signal $V_{LOG2}$.

Figure 18A:
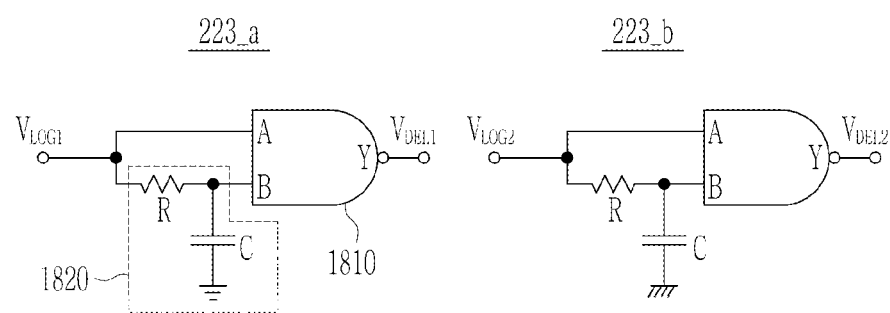
FIG. 18A illustrates a delay circuit according to an embodiment.
Figure 18B:
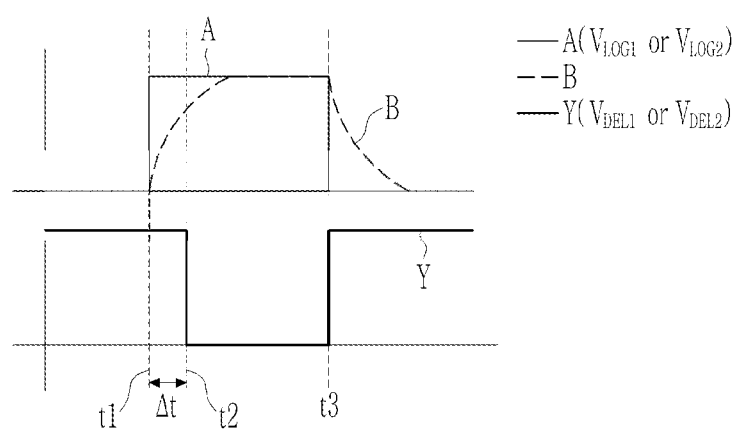
FIG. 18B illustrates a graph of input/output signal timing of a delay circuit according to an embodiment.

FIG. 18A illustrates a delay circuit 223 according to an embodiment, and FIG. 18B illustrates a graph of input/output signal timing of the delay circuit 223 according to the embodiment.

As shown in FIG. 18A, the delay circuit 223 may include a first delay circuit 223_a and a second delay circuit 223_b.

The first delay circuit 223_a receives the first logic signal $V_{LOG1}$, and outputs the first delay signal $V_{DEL1}$. The first delay circuit 223_a may include a NAND gate 1810 and a delay element 1820. The delay element 1820 may include a resistor R and a capacitor C. In the first delay circuit 223_a, 'A' and 'B' indicate input terminals of the NAND gate 1810, and 'Y' indicates an output terminal of the NAND gate 1810. The first logic signal $V_{LOG1}$ is inputted to the input terminal A of the NAND gate 1810. The capacitor C is connected between the input terminal B of the NAND gate 1810 and the ground. The first logic signal $V_{LOG1}$ is inputted to one end of the resistor R, and the other end of the resistor R is connected to the input terminal B of the NAND gate 1810. Here, the delay element 1820 delays the first logic signal $V_{LOG1}$ by a predetermined time and then outputs it to the input terminal B of the NAND gate 1810. A value of an RC time constant is determined by a value of the resistor R and a value of the capacitor C, and a signal is delayed in response to the value of the RC time constant. Meanwhile, the delay element 1820 is an element that delays a signal, and may be implemented through other manners as well as the resistors R and the capacitors C.

Referring to FIG. 18B, at a time t1, the first logic signal $V_{LOG1}$ is changed from a low level to a high level (that is, $V_{LOG1}$ is changed from 0 to 1). That is, at the time t1, the first switch SW1 is changed from an ON state to an OFF state. In this case, the input terminal A is immediately changed from the low level to the high level, but the input terminal B is delayed by a predetermined time Δt by the delay element 1820, and then is changed from the low level to the high level. Accordingly, by an operation characteristic (which outputs the low level only when both inputs thereof are high, and outputs the high level in all other cases) of the NAND gate, the output terminal Y of the NAND gate 1810 is changed from the high level to the low level after the predetermined delay time Δt. Accordingly, when the first switch SW1 is changed from the ON state to the OFF state, a turn-off time point of the first switch SW1 is delayed by the predetermined delay time Δt.

At a time t2, both input terminals A and B of the NAND gate 1810 are substantially both high level, so the output terminal Y of the NAND gate 1810 becomes a low level.

Meanwhile, at a time t3, the first logic signal $V_{LOG1}$ may be changed from a high level to a low level ($V_{LOG1}$ is changed from 1 to 0). That is, at the time t3, the first switch SW1 is changed from an OFF state to an ON state. In this case, the input terminal A is immediately changed from the high level to the low level, but the input terminal B is delayed by a predetermined time by the delay element 1820, and then is changed from the high level to the low level. Accordingly, by an operation characteristic (which outputs the high level when only one of the two inputs is low) of the NAND gate, the output terminal Y of the NAND gate 1810 is immediately changed from the low level to the high level without a delay time.

In other words, the first delay circuit 223_*a* causes a delay of the output signal thereof only when the first logic signal $V_{LOG1}$ is changed from a low level to a high level, and immediately generates the output signal thereof without delay when the first logic signal $V_{LOG1}$ is changed from a high level to a low level. The case in which the first logic signal $V_{LOG1}$ is changed from a low level to a high level corresponds to the case in which the first switch SW1 is changed from an ON state to an OFF state, and the first switch SW1 is delayed by a predetermined time and then is turned off. In addition, the case in which the first logic signal $V_{LOG1}$ is changed from a high level to a low level corresponds to the case in which the first switch SW1 is changed from an OFF state to an ON state, and the first switch SW1 is immediately turned on without delay.

The second delay circuit 223_*b* receives the second logic signal $V_{LOG2}$, and outputs the second delay signal $V_{DEL2}$. As shown in FIG. 18A, the second delay circuit 223_*b* has the same inner configuration as the first delay circuit 223_*a* except for receiving the second logic signal $V_{LOG2}$, so a redundant description will be omitted. The second delay circuit 223_*b* causes a delay of the output signal thereof only when the second logic signal $V_{LOG2}$ is changed from a low level to a high level, and immediately generates the output signal thereof without delay when the second logic signal $V_{LOG2}$ is changed from a high level to a low level.

When switching is changed between the first switch SW1 and the second switch SW2, the overlapping-on period that is a period in which the first and second switches SW1 and SW2 are simultaneously turned on may be generated by the delay circuit 223 as described above. For example, when the first switch SW1 is changed from the ON state to the OFF state, it is turned off as late as the RC time constant, and the second switch SW2 is immediately turned on without delay. Accordingly, the first and second switches SW1 and SW2 are simultaneously turned on during the RC time constant. Here, the RC time constant may correspond to the overlapping-on period. The overlapping-on period generated by the delay circuit 223 will be described in more detail with reference to FIG. 19 below.

The buffer circuit 222' receives the first and second delay signals $V_{DEL1}$ and $V_{DEL2}$ from the delay circuit 223, and outputs switching driving signals $V_{SW1}'$ and $V_{SW2}'$. The buffer circuit 222' converts the first delay signal $V_{DEL1}$ into the first switching driving signal $V_{SW1}'$, and converts the second delay signal $V_{DEL2}$ into the second switching driving signal $V_{SW2}'$. The first delay signal $V_{DEL1}$ and the second delay signal $V_{DEL2}$ are logic signals and have low current levels, so that the buffer circuit 222' converts the first delay signal $V_{DEL1}$ and the second delay signal $V_{DEL2}$ into the first switching driving signal $V_{SW1}'$ and the second switching driving signal $V_{SW2}'$ having a high current level, respectively.

The buffer circuit 222' according to the present embodiment receives the highest voltage $V_{HIGH}$ selected by the voltage selector 230, and generates first and second switching driving signals $V_{SW1}'$ and $V_{SW2}'$ by using the highest voltage $V_{HIGH}$. When the first and second switching driving signals $V_{SW1}'$ and $V_{SW2}'$ have a high voltage level, the first and second switching driving signals $V_{SW1}'$ and $V_{SW2}'$ may be the highest voltage $V_{HIGH}$. When the first and second switches SW1 and SW2 are implemented as p-type transistors, the buffer circuit 222' may output the first and second switching driving signals $V_{SW1}'$ and $V_{SW2}'$ having the highest voltage $V_{HIGH}$ as an OFF driving signal.

Here, the first and second switching driving signals $V_{SW1}'$ and $V_{SW2}'$ have a low voltage level (for example, 0 V or a negative (−) voltage), the first and second switches SW1 and SW2 may be turned on. In addition, the first and second switching driving signals $V_{SW1}'$ and $V_{SW2}'$ have a high voltage (for example, 3 V), so the first and second switches SW1 and SW2 may be turned off. Accordingly, the buffer circuit 222' according to the present embodiment may be implemented as an inverter buffer so that it may output a high voltage when the delay signals $V_{DEL1}$ and $V_{DEL2}$ have a low level and may output a low voltage when the delay signals $V_{DEL1}$ and $V_{DEL2}$ have a high level.

Figure 19:
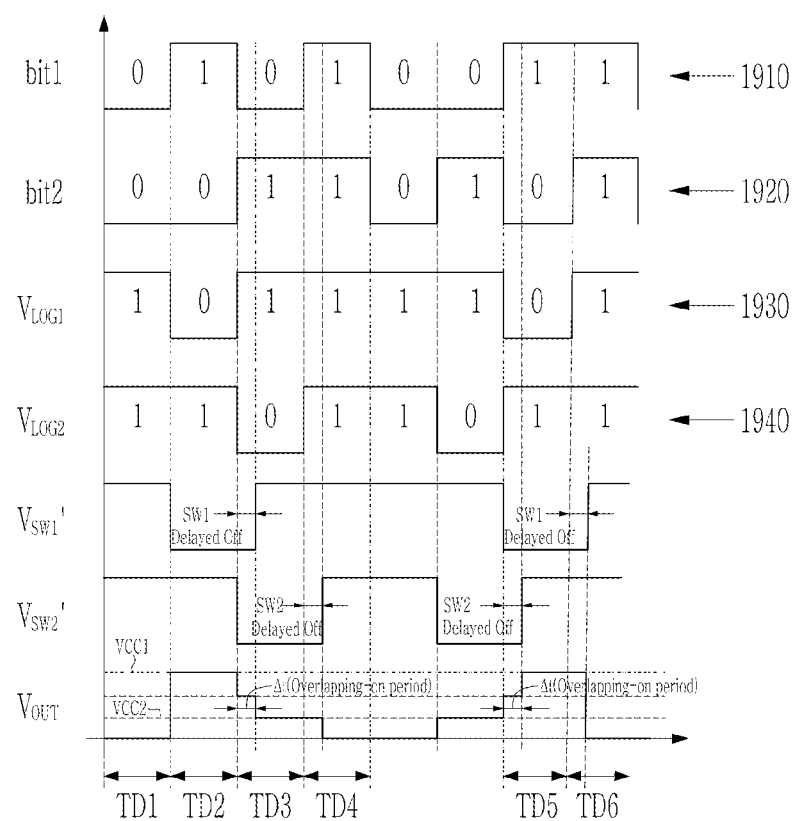
FIG. 19 illustrates an operation timing graph with respect to the power supply switch circuit of FIG. 17.

FIG. 19 illustrates an operation timing graph with respect to the power supply switch circuit 200''' of FIG. 17. FIG. 19 illustrates the first logic signal $V_{LOG1}$, the second logic signal $V_{LOG2}$, the first switching driving signal $V_{SW1}'$, the second switching driving signal $V_{SW2}'$, and the power supply terminal voltage $V_{OUT}$, according to external bit signals bit1 and bit2.

When the first and second bit signals bit1 and bit2 such as reference numerals 1910 and 1920 are inputted, the logic circuit 221 outputs the first logic signal $V_{LOG1}$ such as reference numeral 1930 and the second logic signal $V_{LOG2}$ such as reference numeral 1940.

In a period TD1, the first logic signal $V_{LOG1}$ is at a high level, and the second logic signal $V_{LOG2}$ is also at a high level. In this case, both the first and second switching driving signals $V_{SW1}'$ and $V_{SW2}'$ have a high voltage, and the first and second switches SW1 and SW2 are turned off. Accordingly, the power supply switch circuit 200''' does not apply both power supply voltages VCC1 and VCC2 to the power supply terminal T_VCC.

In a period TD2, the first logic signal $V_{LOG1}$ is at a low level, and the second logic signal $V_{LOG2}$ is at a high level. In this case, the first switching driving signal $V_{SW1}'$ has a low voltage and the second switching driving signal $V_{SW2}'$ has a high voltage, so the first switch SW1 is turned on and the second switch SW2 is maintained in the turned off state. Accordingly, the power supply terminal voltage $V_{OUT}$ becomes the first power supply voltage VCC1.

In a period TD3, the first logic signal $V_{LOG1}$ is at a high level, and the second logic signal $V_{LOG2}$ is at a low level. That is, when the period TD2 and the period TD3 are considered together, the first logic signal $V_{LOG1}$ is changed from the low level to the high level. As described above with reference to FIG. 18A and FIG. 18B, when a logic signal is changed from a low level to a high level (changed from 0 to 1), the delay circuit 223 causes a delay of an output signal thereof. Since the first logic signal $V_{LOG1}$ is changed from the low level to the high level, the first delay circuit 223_*a* causes a delay of an output signal thereof. Accordingly, the first switching driving signal $V_{SW1}'$ is changed from the low voltage to the high voltage after a predetermined delay time Δt, and thus, the turn-off of the first switch SW1 is delayed. In the period TD3, the second switching driving signal $V_{SW2}'$ is immediately changed from a high voltage to a low voltage without a delay time, so the second switch SW2 is immediately turned on. That is, an overlapping-on period in which both the first and second switches SW1 and SW2 are in an ON state occurs at an initial time point of the period TD3. Accordingly, the first power supply voltage VCC1 and the second power supply voltage VCC2 are simultaneously applied to the power supply terminal T_VCC, and the power supply terminal voltage $V_{OUT}$ may be set as a voltage between the first power supply voltage VCC1 and the second power supply voltage VCC2. Meanwhile, in the period TD3, after the predetermined delay time Δt, the first switch SW1 is turned off and the second switch SW2 is maintained in the turned on state, so the power supply terminal voltage $V_{OUT}$ becomes the second power supply voltage VCC2.

In a period TD4, the first logic signal $V_{LOG1}$ is at a high level, and the second logic signal $V_{LOG2}$ is also at a high level. That is, when the period TD3 and the period TD4 are considered together, the second logic signal $V_{LOG2}$ is changed from the low level to the high level. As described above with reference to FIG. 18A and FIG. 18B, when a logic signal is changed from a low level to a high level (changed from 0 to 1), the delay circuit 223 causes a delay of an output signal thereof. Since the second logic signal $V_{LOG2}$ is changed from the low level to the high level, the second delay circuit 223_b causes a delay of an output signal thereof. Accordingly, the second switching driving signal $V_{SW2}'$ is changed from the low voltage to the high voltage after the predetermined delay time Δt, and thus, the turn-off of the second switch SW2 is delayed. By the turn-off delay of the second switch SW2, the power supply terminal voltage $V_{OUT}$ is maintained at the second power supply voltage VCC2 for the predetermined delay time Δt.

In a period TD5, the first logic signal $V_{LOG1}$ is at a low level, and the second logic signal $V_{LOG2}$ is at a high level. That is, the second logic signal $V_{LOG2}$ is at the low level just before the period TD5, and is at the high level in the period TD5, so the second logic signal $V_{LOG2}$ is changed from the low level to the high level at a start point of the period TD5. As described above with reference to FIG. 18A and FIG. 18B, when a logic signal is changed from a low level to a high level (changed from 0 to 1), the delay circuit 223 causes a delay of an output signal thereof. Since the second logic signal $V_{LOG2}$ is changed from the low level to the high level, the second delay circuit 223_b causes a delay of an output signal thereof. Accordingly, the second switching driving signal $V_{SW2}'$ is changed from the low voltage to the high voltage after the predetermined delay time Δt, and thus, the turn-off of the second switch SW2 is delayed. In the period TD5, the first switching driving signal $V_{SW1}'$ is immediately changed from a high voltage to a low voltage without a delay time, so the first switch SW1 is immediately turned on. That is, an overlapping-on period in which both the first and second switches SW1 and SW2 are in a turned on state occurs at an initial time point of the period TD5. Accordingly, the first power supply voltage VCC1 and the second power supply voltage VCC2 are simultaneously applied to the power supply terminal T_VCC, and the power supply terminal voltage $V_{OUT}$ may be set as a voltage between the first power supply voltage VCC1 and the second power supply voltage VCC2. Meanwhile, in the period TD5, after the predetermined delay time Δt, the second switch SW2 is turned off and the first switch SW1 is maintained in the turned on state, so the power supply terminal voltage $V_{OUT}$ becomes the first power supply voltage VCC1.

In a period TD6, the first logic signal $V_{LOG1}$ is at a high level, and the second logic signal $V_{LOG2}$ is also at a high level. That is, when the period TD5 and the period TD6 are considered together, the first logic signal $V_{LOG1}$ is changed from the low level to the high level. As described above with reference to FIG. 18A and FIG. 18B, when a logic signal is changed from a low level to a high level (changed from 0 to 1), the delay circuit 223 causes a delay of an output signal thereof. Since the first logic signal $V_{LOG1}$ is changed from the low level to the high level, the first delay circuit 223_a causes a delay of an output signal thereof. Accordingly, the first switching driving signal $V_{SW1}'$ is changed from the low voltage to the high voltage after the predetermined delay time Δt, and thus, the turn-off of the first switch SW1 is delayed. By the turn-off delay of the first switch SW1, the power supply terminal voltage $V_{OUT}$ is maintained at the first power supply voltage VCC1 for the predetermined delay time Δt.

As described above, the power supply switch circuit 200''' according to the present embodiment, when changing the first power supply voltage VCC1 to the second power supply voltage VCC2 to supply it to the power supply terminal T_VCC, may simultaneously supply the first and second power supply voltages VCC1 and VCC2 to the power supply terminal. That is, when the first switch SW1 is changed to the turned off state and the second switch SW2 is changed to the turn on state (for example, the period TD3 in FIG. 19), the overlapping-on period in which the first switch SW1 and the second switch SW2 are simultaneously turned on may be set. In addition, the power supply switch circuit 200''' according to the present embodiment, even when changing the second power supply voltage VCC2 to the first power supply voltage VCC1 to supply it to the power supply terminal T_VCC, may simultaneously supply the first and second power supply voltages VCC1 and VCC2 to the power supply terminal. That is, when the first switch SW1 is changed to the turned on state and the second switch SW2 is changed to the turn off state (for example, the period TD5 in FIG. 19), the overlapping-on period in which the first switch SW1 and the second switch SW2 are simultaneously turned on may be set. According to the present embodiment described above, when the switching is changed between the first switch SW1 and the second switch SW2, it is possible to prevent the power amplifier 300 from being turned off by continuously supplying the power supply voltage without interruption.

According to at least one of the embodiments as described herein, it is possible to reduce the number of power supply circuits, by selectively providing a power supply voltage to a power amplifier through a power supply switch circuit.

According to at least one of the embodiments as described herein, it is possible to prevent a leakage current, by selecting a high voltage from power supply voltages used and applying it to a body terminal of a transistor.

According to at least one of the embodiments as described herein, it is possible to effectively turn on or turn off a transistor, by selecting a high voltage from power supply voltages used and applying it to a gate terminal of the transistor.

According to at least one of the embodiments as described herein, it is possible to maintain turn-on resistance to be low even in a wide input voltage range, by configuring a switch of a power supply switch circuit with a p-type transistor and an n-type transistor connected in parallel to each other.

According to at least one of the embodiments as described herein, it is possible to continuously supply a power supply voltage without interruption while a power supply switch circuit is switched.

While specific examples have been shown and described above, it will be apparent after an understanding of this disclosure that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A power supply switch circuit, comprising:
a first transistor that switches supplying of a first power supply voltage to a power supply terminal of a power amplifier;
a switch controller that controls the first transistor and to which a second power supply voltage is applied; and
a voltage selector that selects a higher voltage among the first power supply voltage and the second power supply voltage,
wherein the selected higher voltage is applied to a body terminal of the first transistor or a gate terminal of the first transistor.

2. The power supply switch circuit of claim 1, further comprising
a second transistor that switches supplying of a third power supply voltage to the power supply terminal,
wherein the voltage selector selects a highest voltage among the first power supply voltage, the second power supply voltage, and the third power supply voltage as the selected higher voltage.

3. The power supply switch circuit of claim 2, wherein the voltage selector comprises:
a first selection circuit that compares two of the first power supply voltage, the second power supply voltage, and the third power supply voltage to output a first voltage that is a higher voltage thereof; and
a second selection circuit that compares the first voltage with the remaining power supply voltage except for the two power supply voltages and outputs the selected higher voltage.

4. The power supply switch circuit of claim 2, wherein the switch controller sets the first and second transistors to be simultaneously turned on during a first period when the first transistor is turned off and the second transistor is turned on.

5. The power supply switch circuit of claim 4, wherein the switch controller maintains turning on of the first transistor by delaying turning off of the first transistor during the first period.

6. The power supply switch circuit of claim 4, wherein the switch controller comprises a delay circuit delaying a first logic signal that controls the first transistor and a second logic signal that controls the second transistor.

7. The power supply switch circuit of claim 6, wherein the delay circuit comprises:
a first delay circuit comprising a first delay element delaying the first logic signal, and a first NAND gate receiving the first logic signal and a signal delayed by the first delay element; and
a second delay circuit comprising a second delay element delaying the second logic signal, and a second NAND gate receiving the second logic signal and a signal delayed by the second delay element.

8. The power supply switch circuit of claim 7, wherein each of the first and second delay elements comprises a resistor and a capacitor, and the first and second logic signals are delayed corresponding to a value of a time constant determined by the resistor and the capacitor.

9. The power supply switch circuit of claim 1, wherein when the first transistor is a p-type transistor, the selected higher voltage is applied to the body terminal and the gate terminal of the first transistor.

10. The power supply switch circuit of claim 1, wherein when the first transistor is an n-type transistor, the selected higher voltage is applied to the gate terminal of the first transistor.

11. The power supply switch circuit of claim 1, wherein the switch controller comprises a buffer circuit that receives the selected higher voltage and generates a switching control signal having the selected higher voltage, and
the switching control signal is applied to the gate terminal of the first transistor.

12. The power supply switch circuit of claim 1, further comprising
a second transistor that is connected in parallel to the first transistor and switches supplying the first power supply voltage to the power supply terminal together with the first transistor,
wherein the first transistor is a p-type transistor and the second transistor is an n-type transistor, and
wherein the selected higher voltage is applied to a gate terminal of the second transistor.

13. The power supply switch circuit of claim 12, wherein the p-type transistor and the n-type transistor are simultaneously turned on and simultaneously turned off.

14. The power supply switch circuit of claim 1, wherein the first power supply voltage varies according to an envelope of a radio frequency (RF) signal inputted to the power amplifier.

15. The power supply switch circuit of claim 1, wherein the voltage selector comprises:
a comparator that compares the first power supply voltage and the second power supply voltage;
a first switch that switches the first power supply voltage as the selected higher voltage in response to an output of the comparator; and
a second switch that switches the second power supply voltage as the selected higher voltage in response to the output of the comparator.

16. The power supply switch circuit of claim 1, wherein the second power supply voltage is a driving power supply voltage used to operate the switch controller.

17. A power supply switch circuit, comprising:
a first transistor connected between a first power supply circuit outputting a first voltage and a power supply terminal of a power amplifier;
a second transistor connected between a second power supply circuit outputting a second voltage and the power supply terminal;
a switch controller that controls the first and second transistors and to which a third voltage is applied; and
a voltage selector that selects a higher voltage among at least one of the first voltage and the second voltage, and the third voltage,
wherein the selected higher voltage is applied to a body terminal or gate terminal of at least one of the first and second transistors.

18. The power supply switch circuit of claim 17, wherein the voltage selector selects a highest voltage among the first voltage, the second voltage, and the third voltage as the selected higher voltage.

19. The power supply switch circuit of claim 17, wherein when the at least one of the first and second transistors is a p-type transistor, the selected higher voltage is applied to a body terminal and a gate terminal of the at least one of the first and second transistors.

20. The power supply switch circuit of claim 17, wherein the switch controller comprises a buffer circuit that is supplied with the selected higher voltage and generates a switching control signal having the selected higher voltage, and
the switching control signal is applied to a gate terminal of the at least one of the first and second transistors.

21. The power supply switch circuit of claim 17, further comprising
a third transistor that is connected in parallel to the at least one of the first and second transistors and is switched together with the at least one of the first and second transistors,
wherein the at least one of the first and second transistors is a p-type transistor and the third transistor is an n-type transistor, and
the selected higher voltage is applied to a gate terminal of the third transistor.

22. The power supply switch circuit of claim 17, wherein the first and second voltages vary according to an envelope of a radio frequency (RF) signal inputted to the power amplifier.

23. The power supply switch circuit of claim 17, wherein the third voltage is a driving power supply voltage used to operate the switch controller.

24. An operating method of a power supply switch circuit including a switch circuit that switches at least one of a first power supply voltage and a second power supply voltage to supply the at least one of the first power supply voltage and the second power supply voltage to a power supply terminal of a power amplifier, and a switch controller that controls the switch circuit, the operating method comprising:
selecting a higher voltage among at least one of the first power supply voltage and the second power supply voltage, and a third power supply voltage applied to the switch controller; and
applying the selected higher voltage to a body terminal or gate terminal of a transistor included in the switch circuit.

25. The operating method of claim 24, wherein
the selecting includes selecting a highest voltage among the first power supply voltage, the second power supply voltage, and the third power supply voltage as the selected higher voltage.

26. The operating method of claim 24, wherein
the applying includes applying, when the transistor is a p-type transistor, the selected higher voltage to a body terminal and a gate terminal of the transistor.

27. The operating method of claim 24, further comprising:
in a first period, by turning on a first switch switching the first power supply voltage and by turning off a second switch switching the second power supply voltage, supplying the first power supply voltage to the power supply terminal;
in a second period, by maintaining a turned on state of the first switch and by turning on the second switch, simultaneously supplying the first power supply voltage and the second power supply voltage to the power supply terminal; and
after the second period, by turning off the first switch and by maintaining a turned on state of the second switch, supplying the second power supply voltage to the power supply terminal.

28. The operating method of claim 27, wherein
in the second period, a logic signal controlling turning off of the first switch is delayed during the second period.

29. The operating method of claim 27, wherein
in the second period, a voltage between the first power supply voltage and the second power supply voltage is supplied to the power supply terminal.

30. The operating method of claim 24, wherein
the third power supply voltage is a driving power supply voltage used to operate the switch controller.

31. A power supply switch circuit, comprising:
a voltage selector to select a highest voltage of at least one of a first power supply voltage and a second power supply voltage, and a third power supply voltage;
a switch circuit comprising a first switch to switch the first voltage to a power supply terminal of a power amplifier, and a second switch to switch the second voltage to the power supply terminal of the power amplifier; and
a switch controller to which the third power supply voltage is applied to control the switch circuit to supply the at least one of the first power supply voltage and the second power supply voltage to the power supply terminal in response to the selection of the highest voltage.

32. The power supply switch circuit of claim 31, wherein one or more of the first switch and the second switch comprises a transistor, and
wherein the selected highest voltage is applied to a body terminal or gate terminal of at least one transistor of the one or more of the first switch and the second switch.

33. The power supply switch circuit of claim 32, wherein the voltage selector selects the highest voltage among the first power supply voltage, the second power supply voltage, and the third power supply voltage as the selected highest voltage.

34. The power supply switch circuit of claim 32, wherein the at least one transistor is one or more of a p-type transistor and an n-type transistor,
wherein when the at least one transistor is a p-type transistor, the selected highest voltage is applied to a body terminal and a gate terminal of the at least one transistor, and
wherein when the at least one transistor is an n-type transistor, the selected highest voltage is applied to the gate terminal of the at least one transistor.

35. The power supply switch circuit of claim 32, wherein the switch controller comprises a buffer circuit that receives the selected highest voltage and generates a switching control signal having the selected highest voltage, and
wherein the switching control signal is applied to a gate terminal of the at least one transistor.

* * * * *